(12) United States Patent
Inoue et al.

(10) Patent No.: US 7,561,610 B2
(45) Date of Patent: Jul. 14, 2009

(54) SEMICONDUCTOR LASER APPARATUS AND OPTICAL APPARATUS

(75) Inventors: Daijiro Inoue, Kyoto (JP); Yasuyuki Bessho, Hirakata (JP); Masayuki Hata, Kadoma (JP); Yasuhiko Nomura, Moriguchi (JP)

(73) Assignee: Sanyo Electric Co., Ltd., Osaka (JP)

( * ) Notice: Subject to any disclaimer, the term of this patent is extended or adjusted under 35 U.S.C. 154(b) by 234 days.

(21) Appl. No.: 11/078,626

(22) Filed: Mar. 14, 2005

(65) Prior Publication Data

US 2005/0232321 A1 Oct. 20, 2005

(30) Foreign Application Priority Data

Mar. 30, 2004 (JP) ............................ 2004-101489
Feb. 9, 2005 (JP) ............................ 2005-033099

(51) Int. Cl.
*H01S 3/00* (2006.01)
*H01L 31/12* (2006.01)

(52) U.S. Cl. ............... 372/50.121; 372/38.1; 372/38.04; 372/38.05; 372/50.12; 372/50.122; 257/81; 257/99

(58) Field of Classification Search ................ 372/38.1, 372/38.04, 38.05, 50.12, 50.121, 50.122; 257/81, 99
See application file for complete search history.

(56) References Cited

U.S. PATENT DOCUMENTS

| | | | | |
|---|---|---|---|---|
| 4,172,261 | A * | 10/1979 | Tsuzuki et al. | 257/717 |
| 4,887,271 | A * | 12/1989 | Taylor | 372/38.04 |
| 6,654,399 | B1 * | 11/2003 | Kimura et al. | 372/50.1 |
| 6,876,004 | B2 * | 4/2005 | Rosenberg et al. | 257/81 |
| 6,956,322 | B2 | 10/2005 | Ikeda | |
| 7,116,627 | B2 * | 10/2006 | Yoo et al. | 369/112.01 |
| 7,201,497 | B2 * | 4/2007 | Weaver et al. | 362/296 |

(Continued)

FOREIGN PATENT DOCUMENTS

CN 1316810 A 10/2001

(Continued)

OTHER PUBLICATIONS

Principles of Optics, By Born and Wolff, 7th Edition (1999), the copyright page and pp. 186-189.*

(Continued)

*Primary Examiner*—Kenneth A Parker
*Assistant Examiner*—Hrayr A. Sayadian
(74) *Attorney, Agent, or Firm*—McDermott Will & Emery LLP

(57) ABSTRACT

A semiconductor laser apparatus comprises a first semiconductor laser device that emits a blue-violet laser beam, a second semiconductor laser device that emits a red laser beam, and a conductive package body. The first semiconductor laser device has a p-side pad electrode and an n-side electrode. The p-side pad electrode and n-side electrode of the first semiconductor laser device are electrically isolated from the package body. The p-side pad electrode of the first semiconductor laser device is connected with a drive circuit that generates a positive potential, while the n-side electrode thereof is connected with a dc power supply that generates a negative potential.

16 Claims, 30 Drawing Sheets

U.S. PATENT DOCUMENTS

| | | | |
|---|---|---|---|
| 2001/0050531 A1* | 12/2001 | Ikeda | 313/498 |
| 2003/0102157 A1* | 6/2003 | Rosenberg et al. | 174/261 |
| 2004/0109481 A1* | 6/2004 | Ikeda | 372/36 |
| 2004/0196877 A1* | 10/2004 | Kawakami et al. | 372/23 |
| 2004/0208209 A1* | 10/2004 | Okazaki | 372/36 |
| 2005/0025202 A1* | 2/2005 | Kagaya et al. | 372/38.02 |
| 2005/0214957 A1* | 9/2005 | Kihara et al. | 438/14 |
| 2005/0218420 A1* | 10/2005 | Bessho et al. | 257/99 |
| 2005/0220159 A1* | 10/2005 | Bessho et al. | 372/50.12 |
| 2005/0232322 A1* | 10/2005 | Bessho et al. | 372/43.01 |
| 2005/0242361 A1* | 11/2005 | Bessho et al. | 257/99 |
| 2005/0286590 A1* | 12/2005 | Lee | 372/50.12 |
| 2006/0054906 A1* | 3/2006 | Inoue et al. | 257/89 |
| 2006/0076566 A1* | 4/2006 | Ikeda | 257/79 |

FOREIGN PATENT DOCUMENTS

| | | | |
|---|---|---|---|
| EP | 1309047 | * | 11/2004 |
| JP | 2001-230502 | | 8/2001 |
| JP | 2004184869 A | * | 7/2004 |

OTHER PUBLICATIONS

U.S. Appl. No. 11/093,024, filed Mar. 30, 2005, Yasuyuki Bessho, et. al.

U.S. Appl. No. 11/081,726, filed Mar. 17, 2005, Yasuyuki Bessho, et. al.

U.S. Appl. No. 11/076,963, filed Mar. 11, 2005, Yasuyuki Bessho, et. al.

U.S. Appl. No. 11/092,947, filed Mar. 30, 2005, Yasuyuki Bessho, et al.

Chinese Office Action, with English Translation, issued in Chinese Patent Application No. 200510053944.6, dated on Nov. 23, 2007.

* cited by examiner

F I G. 4
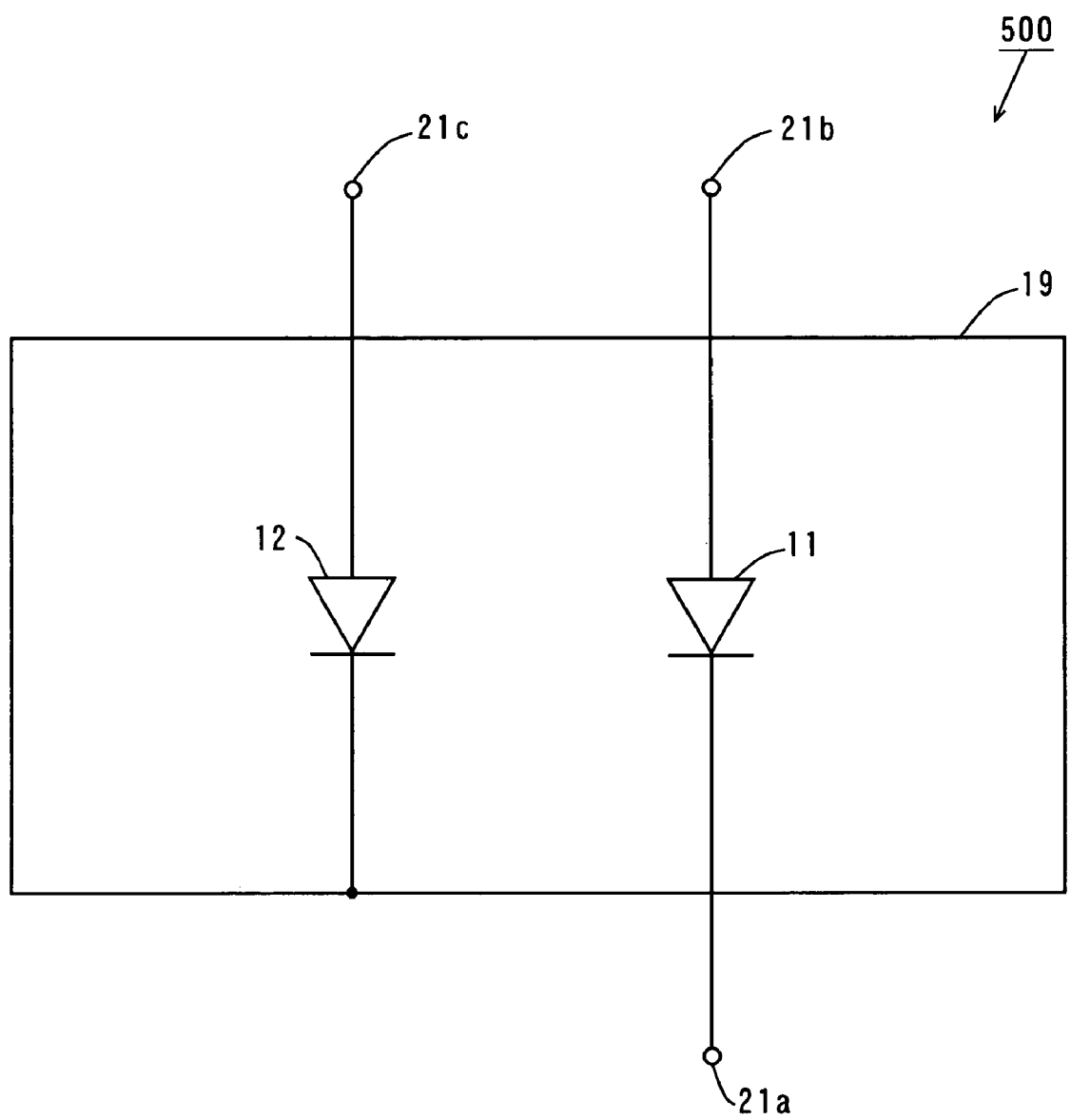

F I G. 1 2
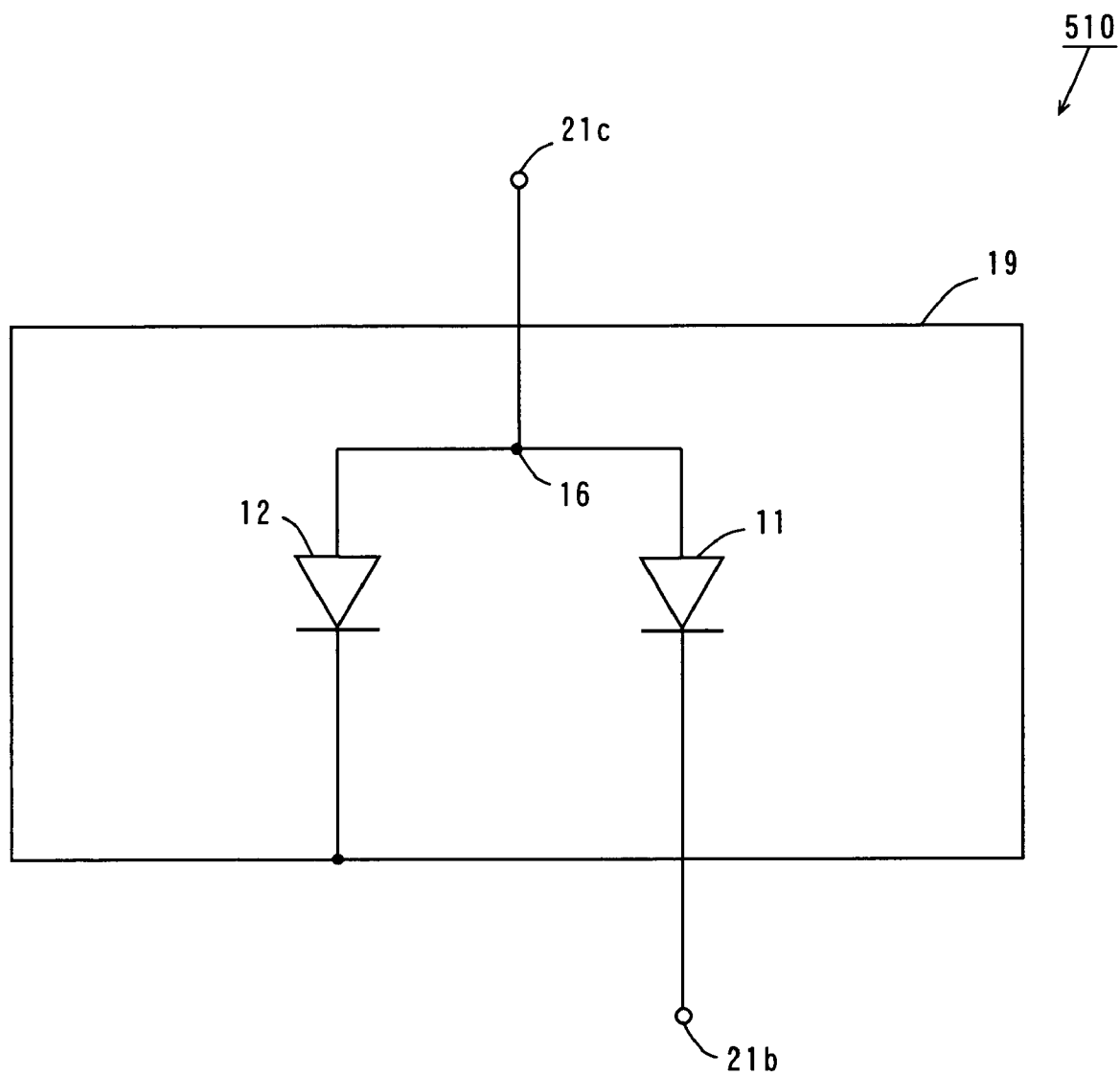

SEMICONDUCTOR LASER APPARATUS AND OPTICAL APPARATUS

BACKGROUND OF THE INVENTION

1. Field of the Invention

The present invention relates to a semiconductor laser apparatus with semiconductor laser devices of different wavelengths, and an optical apparatus therefor.

2. Description of the Background Art

With recent enhancements of the performance of personal computers and multimedia equipment, the amount of information to be processed has markedly increased. The increased amount of information has led to the development of optical recording mediums and their drives which can handle increased capacity and high frequency of information processing.

Specific examples of such optical recording mediums include compact disks (which will hereinafter be referred to as CDs) and digital versatile disks (which will hereinafter be referred to as DVDs). Specific examples of the drives that play back and record such optical recording mediums include semiconductor laser apparatuses for CDs and semiconductor laser apparatuses for DVDs. A semiconductor laser apparatus for a CD is capable of emission of an infrared laser beam (wavelength around 790 nm) used in playing back or recording the CD, while a semiconductor laser apparatus for a DVD is capable of emission of a red laser beam (wavelength around 658 nm) used in playing back or recording the DVD.

Among optical recording medium drives is also a semiconductor laser apparatus that can play back or record a CD and DVD. This semiconductor laser apparatus is capable of emission of an infrared laser beam for the CD and a red laser beam for the DVD.

The use of such a semiconductor laser apparatus enables a smaller parts count than the combined use of a semiconductor laser apparatus for a CD and a semiconductor laser apparatus for a DVD, resulting in a simpler optical recording medium drive.

Meanwhile, in order to enhance the recording density in optical disk systems, the development of semiconductor laser devices for next-generation DVDs which emit blue-violet laser beams with short wavelength (a lasing wavelength of around 400 nm) is progressing. A semiconductor laser apparatus has also been developed which incorporates such a semiconductor laser device that emits a blue-violet laser beam (refer to JP 2001-230502 A).

In the specification, a semiconductor laser device that emits a blue-violet laser beam will be referred to as a blue-violet semiconductor laser device, a semiconductor laser device that emits an infrared laser beam will be referred to as an infrared semiconductor laser device, and a semiconductor laser device that emits a red laser beam will be referred to as a red semiconductor laser device.

Now, the semiconductor laser apparatus as described in JP 2001-230502 A will be illustrated. FIG. 29 is a schematic diagram showing the semiconductor laser apparatus described in JP 2001-230502 A.

As shown in FIG. 29, a blue-violet semiconductor laser device 901 is bonded onto a support base 903a integral with a package body 903 with a fusion layer 905 interposed therebetween. The blue-violet semiconductor laser device 901 is mechanically, electronically connected with the support base 903a.

An infrared semiconductor laser device 902a and a red semiconductor laser device 902b are bonded onto electrodes 901a, 901b, respectively, of the blue-violet semiconductor laser device 901 via fusion layers 906, 907.

The infrared semiconductor laser device 902a and red semiconductor laser device 902b form an integrated semiconductor laser device 902 that is monolithically integrated on the same substrate. In this case, in order for either of the infrared semiconductor laser device 902a or red semiconductor laser device 902b to operate independently, the electrode 901a connected with the infrared semiconductor laser device 902a is formed on the blue-violet semiconductor laser device 901 with an insulating layer 904 therebetween. Power supply pins 909a, 909b, 909c are formed so that they are electrically isolated from the package body 903 through insulating rings 908a, 908b, 908c. An electrode 902c is formed on the upper surface of the integrated semiconductor laser device 902.

The electrodes 901a, 901b, 901c, respectively, are connected to the power supply pins 909a, 909c, 909c through wires 910a, 910b, 910c. The support base 903a receives power from the power supply pin 903b which is connected to the package body 903.

With this structure, the semiconductor laser apparatus can emit any one of an infrared laser beam, a red laser beam, or a blue-violet laser beam selected.

However, for the blue-violet semiconductor laser device 901 that emits a blue-violet laser beam having short wavelength, the lasing threshold voltage is higher than that of the infrared semiconductor laser device 902a that emits an infrared laser beam having long wavelength or the red semiconductor laser device 902b that emits a red laser beam. Such high lasing threshold voltage is attributed to the materials forming the blue-violet semiconductor laser device 901.

FIG. 30 is a circuit diagram of the semiconductor laser apparatus of FIG. 29.

As shown in FIG. 30, in order to drive the blue-violet semiconductor laser device 901 with a high lasing threshold voltage, it is necessary to apply a high voltage to the other power supply pin 909b with respect to the package body 903 which is commonly grounded when used. This precludes the use of a drive circuit available at relatively low cost, which has been conventionally employed to drive the infrared semiconductor laser device 902a and red semiconductor laser device 902b in the semiconductor laser apparatus of JP 2001-230502 A, resulting in a necessity of employing a new drive circuit that can handle high voltage.

SUMMARY OF THE INVENTION

An object of the present invention is to provide a semiconductor laser apparatus comprising a plurality of semiconductor laser devices of different lasing wavelengths and also capable of driving a semiconductor laser device with a short wavelength using a power supply circuit that generates low voltages, and an optical apparatus therefor.

Another object of the present invention is to provide a semiconductor laser apparatus comprising a plurality of semiconductor laser devices of different lasing threshold voltages, and also capable of driving a semiconductor laser device with a high lasing threshold voltage using a power supply circuit that generates low voltages, and an optical apparatus therefor.

According to one aspect of the present invention there is provided a semiconductor laser apparatus comprising: a first semiconductor laser device that has a first electrode and a second electrode and emits a light beam having a first wavelength; a second semiconductor laser device that has a first electrode and a second electrode and emits a light beam having a second wavelength longer than the first wavelength;

and a conductive package that houses the first and the second semiconductor laser devices, the first electrode and the second electrode of the first semiconductor laser device being electrically isolated from the package.

In the semiconductor laser apparatus, the first and the second semiconductor laser devices are housed in the conductive package. Each of the first and the second semiconductor laser devices has the first electrode and the second electrode. The first electrode and the second electrode of the first semiconductor laser device are electrically isolated from the package. The first semiconductor laser device emits the light beam having the first wavelength, and the second semiconductor laser device emits the light beam having the second wavelength longer than the first wavelength.

Note that the first semiconductor laser device that emits the light beam having a shorter wavelength has a lasing threshold voltage higher than that of the second semiconductor laser device that emits the light beam having a longer wavelength. In this case, by connecting the first electrode of the first semiconductor laser device with a power supply circuit that generates a positive potential, and by connecting the second electrode thereof with a power supply circuit that generates a negative potential, a voltage higher than the lasing threshold voltage of the first semiconductor laser device can be applied to the first semiconductor laser device. In this manner, the first semiconductor laser device that emits the light beam having a shorter/wavelength and the second semiconductor laser device that emits the light beam having a longer wavelength are allowed to drive, using the power supply circuit that generates low voltages in the semiconductor laser apparatus with the plurality of semiconductor laser devices of different lasing wavelengths.

Moreover, the electrical insulation of the first semiconductor laser device from the package decreases the parasitic capacitance due to the package, allowing the first semiconductor laser device to operate at high frequency.

The first semiconductor laser device may be made of a material that includes a nitride semiconductor. In this case, the first semiconductor laser device made of a material including a nitride semiconductor is capable of emission of a blue-violet laser beam having a wavelength shorter than the second wavelength. Consequently, the blue-violet laser beam having a microspot diameter enables increased density and capacity in an optical disk system.

The first semiconductor laser device may be arranged closer to a central portion of the package than the second semiconductor laser device.

In this case, the central portion of the package is positioned on a central portion of a coupling lens, so that the light beam having the first wavelength emitted from the first semiconductor laser device passes through the central portion of the lens and focused on a target object. This makes the light beam having the first wavelength shorter than the second wavelength hardly subjected to the effect of aberration by the lens (mainly spherical aberration), allowing for convergence of a laser beam having a microspot.

The first semiconductor laser device may have a first lasing threshold voltage, and the second semiconductor laser device may have a second lasing threshold voltage lower than the first lasing threshold voltage.

In this case, by connecting the first electrode of the first semiconductor laser device with a power supply circuit that generates a positive potential, and by connecting the second electrode of the first semiconductor laser device with a power supply circuit that generates a negative potential, a voltage higher than the first lasing threshold voltage can be applied to the first semiconductor laser device. In this manner, the first semiconductor laser device with a higher lasing threshold voltage and the second semiconductor laser device with a lower lasing threshold voltage are allowed to drive using the power supply circuit that generates low voltages.

The first electrode of the second semiconductor laser device may be electrically connected with the package.

In this case, the electrical connection of the first electrode of the second semiconductor laser device with the package obviates the necessity of providing the second semiconductor laser device with a wire for grounding the first electrode thereof.

The second electrode of the first semiconductor laser device and the second electrode of the second semiconductor laser device may be connected.

In this case, the second electrode of the first semiconductor laser device and the second electrode of the second semiconductor laser device can be connected to a common power supply pin. This enables a smaller number of power supply pins in the semiconductor laser apparatus.

The second electrode of the first semiconductor laser device may be an anode, and the second electrode of the second semiconductor laser device may be an anode.

In this case, a common potential is applied to the anode of each of the first and the second semiconductor laser devices. This enables a simpler structure of the drive circuit.

The second electrode of the first semiconductor laser device may be a cathode, and the second electrode of the second semiconductor laser device may be an anode.

In this case, a common potential is applied to the cathode of the first semiconductor laser device and the anode of the second semiconductor laser device. This prevents flow of current in one of the first and the second semiconductor laser devices while current is flowing in the other. This results in reduced power consumption.

Each of the first and the second semiconductor laser devices may have a front facet and a rear facet that emit light beams, respectively, and the semiconductor laser apparatus may further comprise a photodiode that has a first electrode and a second electrode and receives the light beams emitted from the rear facet of the first and the second semiconductor laser devices, the first electrode of the photodiode being electrically connected with the package.

In this case, the amount of lights from the first and the second semiconductor laser devices can be controlled based on the current outputted from the second electrode of the photodiode.

The semiconductor laser apparatus may further comprise a third semiconductor laser device that has a first electrode and a second electrode and emits a light beam having a third wavelength longer than the first wavelength, the first electrode of the third semiconductor laser device being electrically connected with the package.

This results in obtaining the light beams with the first, second, and third wavelengths. In this case, the electrical connection of the first electrode of the third semiconductor laser device with the package obviates the necessity of providing a wire with the third semiconductor laser device for grounding the first electrode thereof.

The first semiconductor laser device may have a first lasing threshold voltage, and the third semiconductor laser device may have a third lasing threshold voltage lower than the first lasing threshold voltage.

In this case, by connecting the first electrode of the first semiconductor laser device with a power supply circuit that generates a positive potential, and by connecting the second electrode thereof with a power supply circuit that generates a negative potential, a voltage higher than the first lasing threshold voltage can be applied to the first semiconductor laser device. In this manner, the first, second, and third semiconductor laser devices are allowed to drive using the power supply circuit that generates low voltages.

According to another aspect of the present invention there is provided a semiconductor laser apparatus comprising: a first semiconductor laser device that has a first electrode and a second electrode and has a first lasing threshold voltage; a second semiconductor laser device that has a first electrode and a second electrode and has a second lasing threshold voltage lower than the first lasing threshold voltage; and a conductive package that houses the first and the second semiconductor laser devices, the first electrode and the second electrode of the first semiconductor laser device being electrically isolated from the package.

In the semiconductor laser apparatus, the first lasing threshold voltage of the first semiconductor laser device is higher than the second lasing threshold voltage of the second semiconductor laser device. In this case, by connecting the first electrode of the first semiconductor laser device with a power supply circuit that generates a positive potential, and by connecting the second electrode thereof with a power supply circuit that generates a negative potential, a voltage higher than the first lasing threshold voltage can be applied to the first semiconductor laser device. In this manner, the first semiconductor laser device with a higher lasing threshold voltage and the second semiconductor laser device with a lower lasing threshold voltage are allowed to drive using the power supply circuit that generates low voltages in the semiconductor laser apparatus with the plurality of semiconductor laser devices of different lasing wavelengths.

Moreover, the electrical insulation of the first semiconductor laser device from the package decreases the parasitic capacitance due to the package, allowing the first semiconductor laser device to operate at high frequency.

According to still another aspect of the present invention there is provided an optical apparatus comprising: a semiconductor laser apparatus; a first power supply; and a second power supply, wherein the semiconductor laser apparatus comprises: a first semiconductor laser device that has a first electrode and a second electrode and emits a light beam having a first wavelength; a second semiconductor laser device that has a first electrode and a second electrode and emits a light beam having a second wavelength longer than the first wavelength; and a conductive package that houses the first and the second semiconductor laser devices, the first electrode and the second electrode of the first semiconductor laser device being electrically isolated from the package, the second semiconductor laser device being driven by the first power supply, the first power supply applying a potential of one polarity to the second electrode of the first semiconductor laser device, and simultaneously, the second power supply applying a potential of a reverse polarity of the one polarity to the first electrode of the first semiconductor laser device.

In the semiconductor laser apparatus included in the optical apparatus, the first and the second semiconductor laser devices are housed in the conductive package. Each of the first and the second semiconductor laser devices has the first electrode and the second electrode. The first electrode and the second electrode of the first semiconductor laser device are electrically isolated from the package.

Note that the first semiconductor laser device that emits the light beam having a shorter wavelength has a lasing threshold voltage higher than that of the second semiconductor laser device that emits the light beam having a longer wavelength. In this case, the second semiconductor laser device is driven by the first power supply. The first power supply also applies a potential of one polarity to the second electrode of the first semiconductor laser device, while the second power supply applies a potential of the reverse polarity to the first electrode of the first semiconductor laser device. In this manner, a voltage higher than the first lasing threshold voltage is applied to the first semiconductor laser device. This allows the first semiconductor laser device to emit the laser beam having the first wavelength, and the second semiconductor laser device to emit the laser beam having the second wavelength longer than the first wavelength.

In this manner, the first semiconductor laser device that emits the light beam having a shorter wavelength and the second semiconductor laser device that emits the light beam having a longer wavelength are allowed to drive using the power supply circuit that generates low voltages in the optical apparatus with the plurality of semiconductor laser devices of different lasing wavelengths.

The first semiconductor laser device may have a first lasing threshold voltage, and the second semiconductor laser device may have a second lasing threshold voltage lower than the first lasing threshold voltage.

In this case, the first power supply applies a voltage higher than the second lasing threshold voltage to the second semiconductor laser device. The first power supply also applies a potential of one polarity to the second electrode of the first semiconductor laser device, while the second power supply applies a potential of the reverse polarity to the first electrode of the first semiconductor laser device. This allows a voltage higher than the first lasing threshold voltage to be applied to the first semiconductor laser device.

In this manner, the first semiconductor laser device with a higher lasing threshold voltage and the second semiconductor laser device with a lower lasing threshold voltage are allowed to drive using the power supply circuit that generates low voltages in the optical apparatus with the plurality of semiconductor laser devices of different lasing threshold voltages.

Moreover, the electrical insulation of the first semiconductor laser device from the package decreases the parasitic capacitance due to the package, allowing the first semiconductor laser device to operate at high frequency.

The first electrode of the second semiconductor laser device may be electrically connected with the package.

In this case, the electrical connection of the first electrode of the second semiconductor laser device with the package obviates the necessity of providing the second semiconductor laser device with a wire for grounding the first electrode thereof.

The first semiconductor laser device may be made of a material that includes a nitride semiconductor. In this case, the first semiconductor laser device made of a material including a nitride semiconductor is capable of emission of a blue-violet laser beam having a wavelength shorter than the second wavelength. Consequently, the blue-violet laser beam having a microspot diameter enables increased density and capacity in an optical disk system.

The semiconductor laser apparatus may further comprise a third semiconductor laser device that has a first electrode and a second electrode and emits a light beam having a third wavelength longer than the first wavelength, the first electrode of the third semiconductor laser device being electrically connected with the package.

This results in obtaining the light beams with the first, second, and third wavelengths. In this case, the electrical connection of the first electrode of the third semiconductor laser device with the package obviates the necessity of providing a wire with the third semiconductor laser device for grounding the first electrode thereof.

According to yet another aspect of the present invention there is provided an optical apparatus comprising: a semiconductor laser apparatus; a first power supply; and a second power supply, wherein the semiconductor laser apparatus comprises: a first semiconductor laser device that has a first electrode and a second electrode and has a first lasing threshold voltage; a second semiconductor laser device that has a first electrode and a second electrode and has a second lasing threshold voltage lower than the first lasing threshold voltage; and a conductive package that houses the first and the second semiconductor laser devices, the first electrode and the second electrode of the first semiconductor laser device being electrically isolated from the package, the second semiconductor laser device being driven by the first power supply, the first power supply applying a potential of one polarity to the second electrode of the first semiconductor laser device, and simultaneously, the second power supply applying a potential of a reverse polarity of the one polarity to the first electrode of the first semiconductor laser device.

In the semiconductor laser apparatus included in the optical apparatus, the first and the second semiconductor laser devices are housed in the conductive package. Each of the first and the second semiconductor laser devices has the first electrode and the second electrode. The first electrode and the second electrode of the first semiconductor laser device are electrically isolated from the package.

Note that the first lasing threshold voltage of the first semiconductor laser device is higher than the second lasing threshold voltage of the second semiconductor laser device. In this case, the first power supply applies a voltage higher than the second lasing threshold voltage to the second semiconductor laser device. The first power supply also applies a potential of one polarity to the second electrode of the first semiconductor laser device, while the second power supply applies a potential of the reverse polarity to the first electrode of the first semiconductor laser device. In this manner, a voltage higher than the first lasing threshold voltage is applied to the first semiconductor laser device. This allows the first semiconductor laser device to emit a laser beam, and the second semiconductor laser device to emit a laser beam.

Accordingly, the first semiconductor laser device with a higher lasing threshold voltage and the second semiconductor laser device with a lower lasing threshold voltage are allowed to drive using the power supply circuit that generates low voltages in the optical apparatus with the plurality of semiconductor laser devices of different lasing threshold voltages.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a circuit diagram showing electrical wiring of the semiconductor laser apparatus;

FIG. 12 is a circuit diagram showing electrical wiring of the semiconductor laser apparatus;

DESCRIPTION OF THE PREFERRED EMBODIMENTS

First Embodiment

Figure 1:
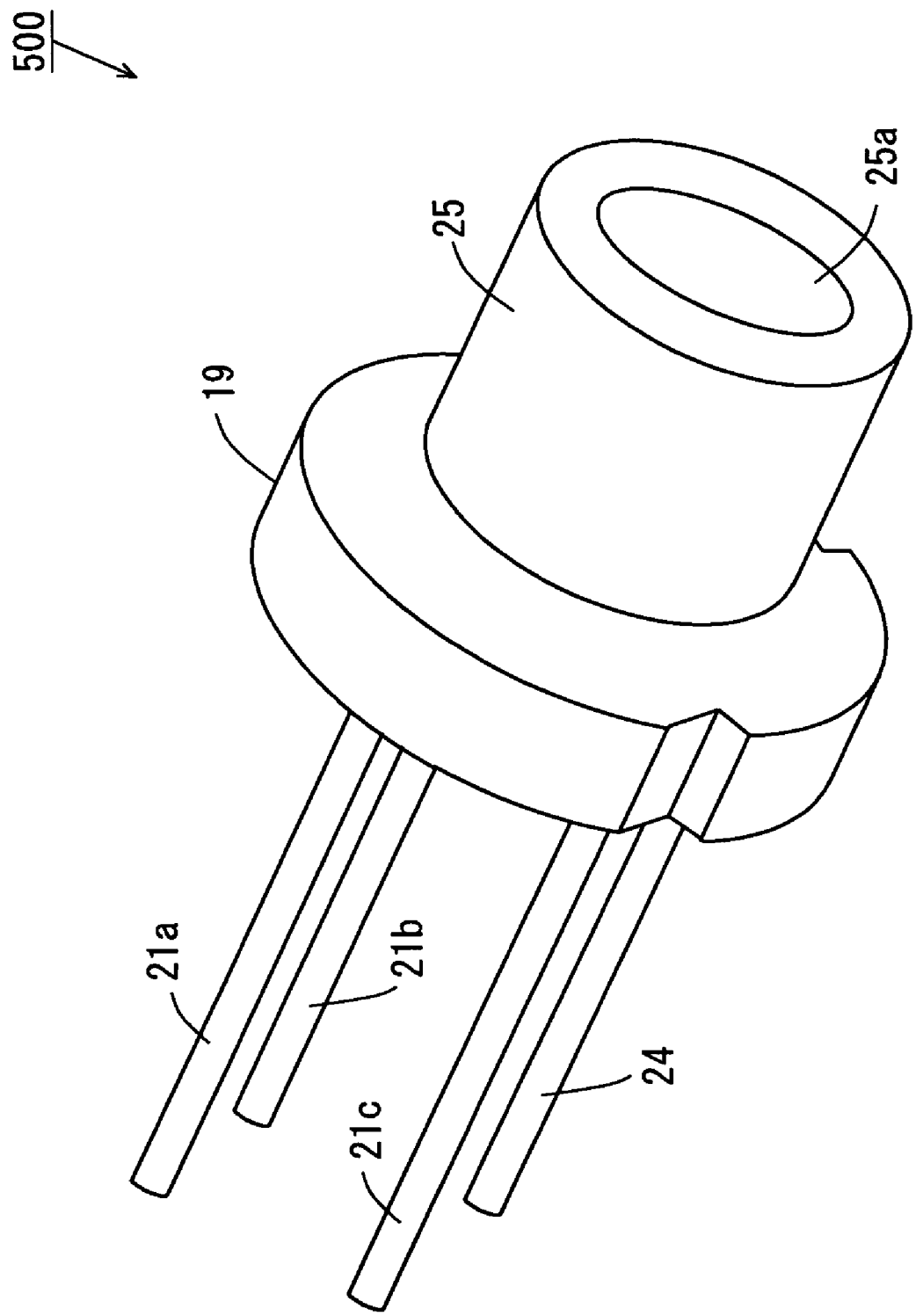
FIG. 1 is an external perspective view showing a semiconductor laser apparatus according to a first embodiment.

FIG. 1 is an external perspective view showing a semiconductor laser apparatus according to a first embodiment.

The semiconductor laser apparatus 500 includes a conductive package body 19, power supply pins 21a, 21b, 21c, 24, and a cap 25, as shown in FIG. 1.

A plurality of semiconductor laser devices which will be described below are housed inside the package body 19. The plurality of semiconductor laser devices housed in the package body 19 are sealed in the cap 25. The cap 25 is provided with a laser extracting window 25a, which is made of a material that transmits laser beams. The power supply pin 24 is mechanically and electrically connected with the package body 19, as will be described below.

Now, an inside of the package body 19 will be described in detail. The direction in which the semiconductor laser devices emit laser beams is defined as a front side.

Figure 2:
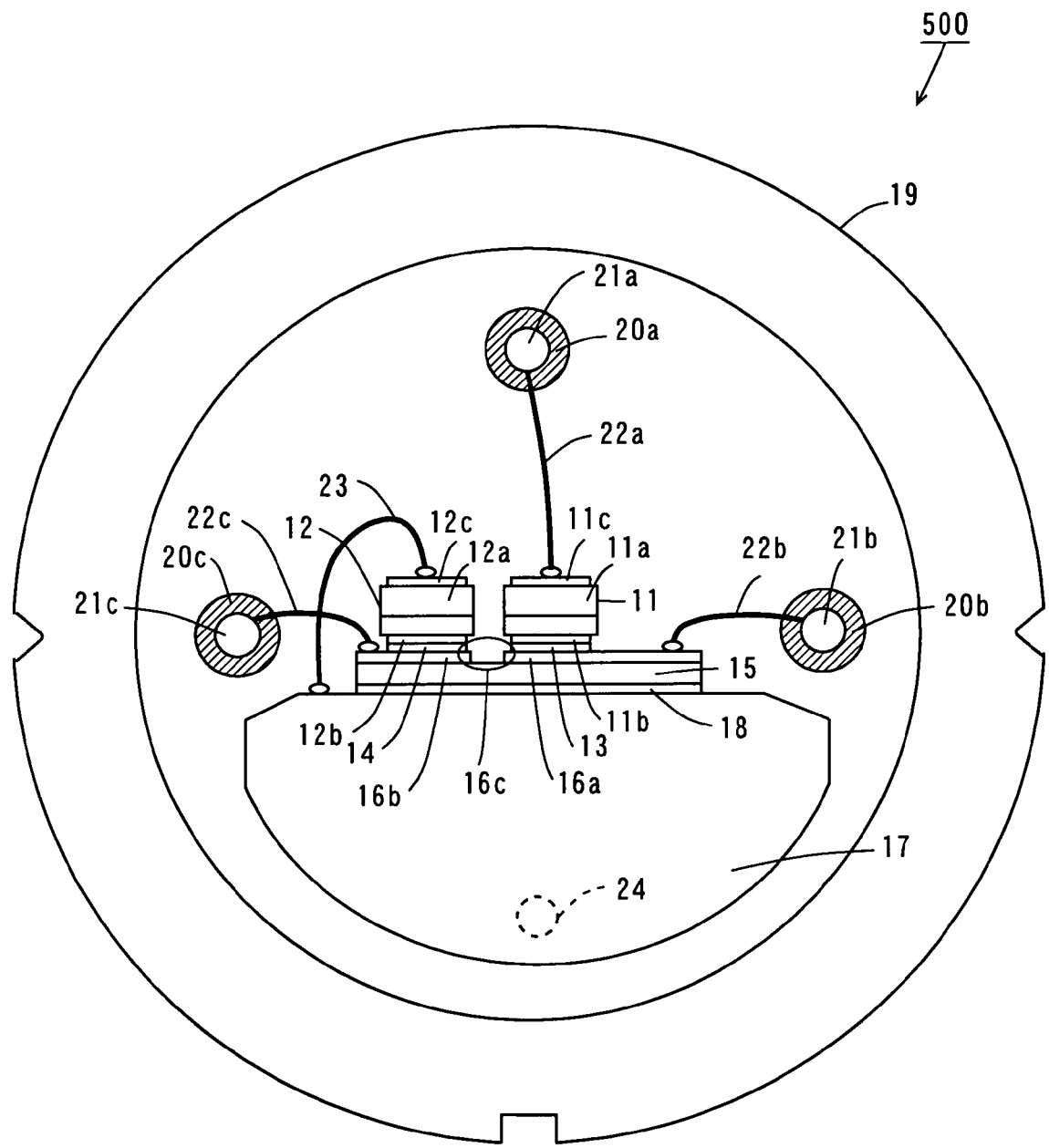
FIG. 2 is a schematic front view showing the semiconductor laser apparatus of FIG. 1 from which the cap has been removed.
Figure 3:
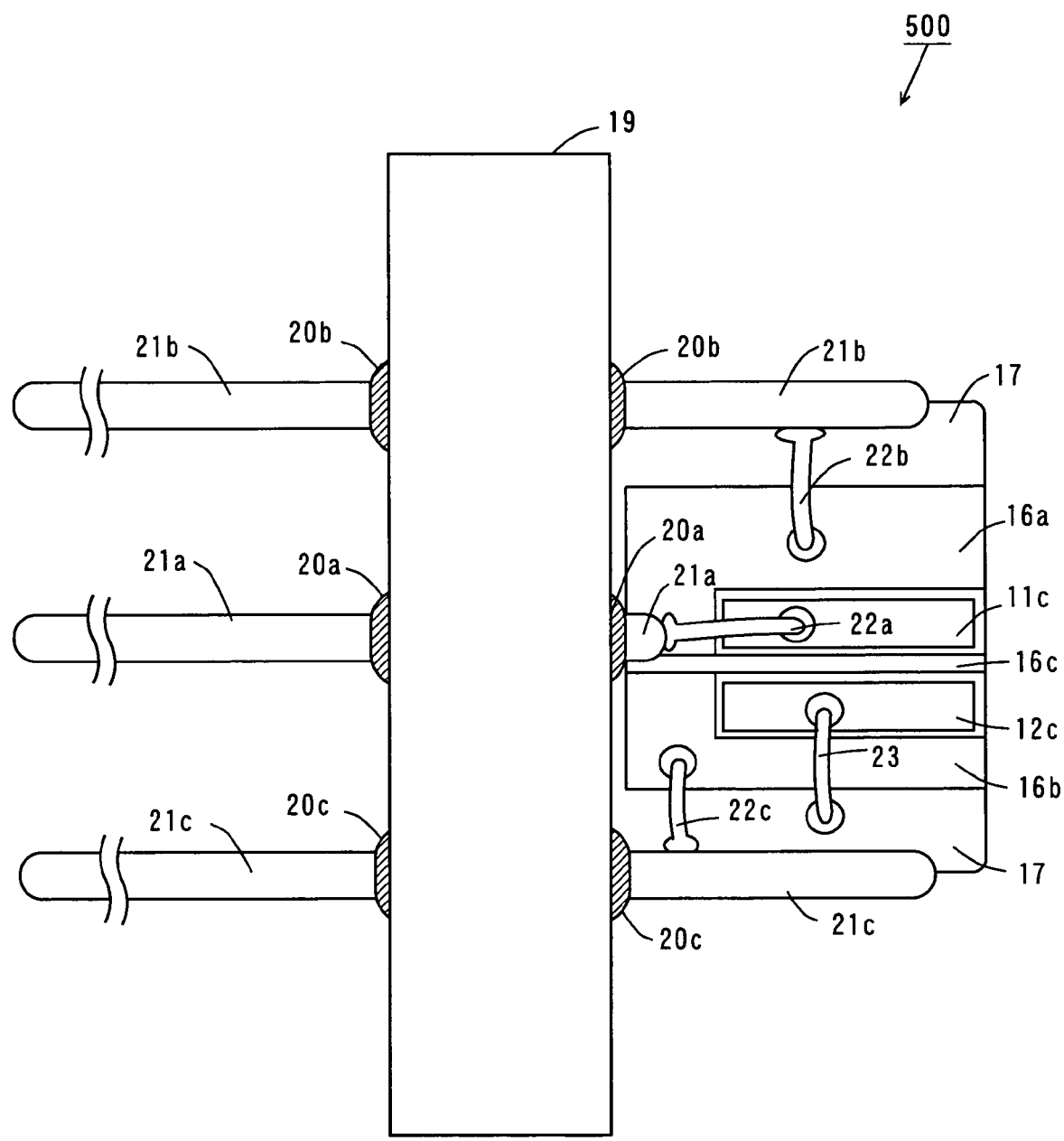
FIG. 3 is a schematic top view showing the semiconductor laser apparatus of FIG. 1 from which the cap has been removed.

FIG. 2 is a schematic front view showing the semiconductor laser apparatus 500 of FIG. 1 from which the cap 25 has been removed. FIG. 3 is a schematic top view showing the semiconductor laser apparatus 500 of FIG. 1 from which the cap 25 has been removed.

As shown in FIG. 2, a conductive fusion layer 18 is formed on a conductive support base 17 integral with the package body 19. The conductive fusion layer 18 is made of AuSn (gold tin). On the conductive fusion layer 18, a submount 15 made of an insulator is formed. Metallic layers 16a, 16b are formed on the submount 15. The metallic layers 16a, 16b are electrically isolated from each other by the provision of a gap 16c.

A fusion layer 13 is formed on the metallic layer 16a, and a fusion layer 14 is formed on the metallic layer 16b. The fusion layers 13, 14 are each made of conductive AuSn (gold tin). A first semiconductor laser device 11 is bonded onto the fusion layer 13, and a second semiconductor laser device 12 is bonded onto the fusion layer 14.

The first semiconductor laser device 11 has a laminated structure that includes a p-side pad electrode 11b, an n-type GaN (gallium nitride) substrate 11a, and an n-side electrode 11c in order. The p-side pad electrode 11b of the first semiconductor laser device 11 is electrically connected with the metallic layer 16a. The first semiconductor laser device 11 of the first embodiment, which includes a GaN-based semiconductor layer formed on the n-type GaN substrate 11a, has a wavelength of approximately 400 nm (i.e., lasing wavelength). The GaN-based semiconductor layer will be discussed below.

The second semiconductor laser device 12, on the other hand, has a laminated structure that includes a p-side pad electrode 12b, an n-type GaAs (gallium arsenide) substrate 12a, and an n-side electrode 12c in order. The p-side pad electrode 12b is electrically connected with the metallic layer 16b. The second semiconductor laser device 12 of the first embodiment, which includes an AlGaInP (aluminum gallium indium phosphide)-based semiconductor layer formed on the n-type GaAs substrate 12a, has a wavelength of approximately 660 nm (i.e., lasing wavelength). The AlGaInP-based semiconductor layer will be discussed below.

The first semiconductor laser device 11 is arranged in a position closer to the central portion of the laser extracting window 25a of the cap 25 (see FIG. 1) than the second semiconductor laser device 12. The arrangement of the first semiconductor laser device 11 will be discussed in detail below.

The metallic layer 16a is electrically connected with the power supply pin 21b through a wire 22b, as shown in FIGS. 2 and 3. The power supply pin 21b is electrically isolated from the package body 19 through an insulating ring 20b. The metallic layer 16b is electrically connected with the power supply pin 21c through a wire 22c. The power supply pin 21c is electrically isolated from the package body 19 through an insulating ring 20c.

The n-side electrode 11c of the first semiconductor laser device 11 is electrically connected with the power supply pin 21a through a wire 22a. The power supply pin 21a is electrically isolated from the package body 19 through an insulating ring 20a. Then-side electrode 12c of the second semiconductor laser device 12 is electrically connected to the support base 17 through a wire 23. This results in a structure that the n-side electrode 12c of the second semiconductor laser device 12 can receive power from the power supply pin 24 which is connected to the package body 19. The wires 22a, 22b, 22c, 23 are each made of Au (gold).

Now refer to FIG. 4 which is a circuit diagram showing electrical wiring of the semiconductor laser apparatus 500.

As shown in FIG. 4, the p-side pad electrode 11b and the n-side electrode 11c of the first semiconductor laser device 11 are electrically isolated from the package body 19. The p-side pad electrode 11b of the first semiconductor laser device 11 is connected to the power-supply pin 21b, and the n-side electrode 11c is connected to the power-supply pin 21a.

On the other hand, the p-side pad electrode 12b of the second semiconductor laser device 12 is electrically connected to the power-supply pin 21c, and the n-side electrode 12c is electrically connected to the package body 19.

Figure 5:
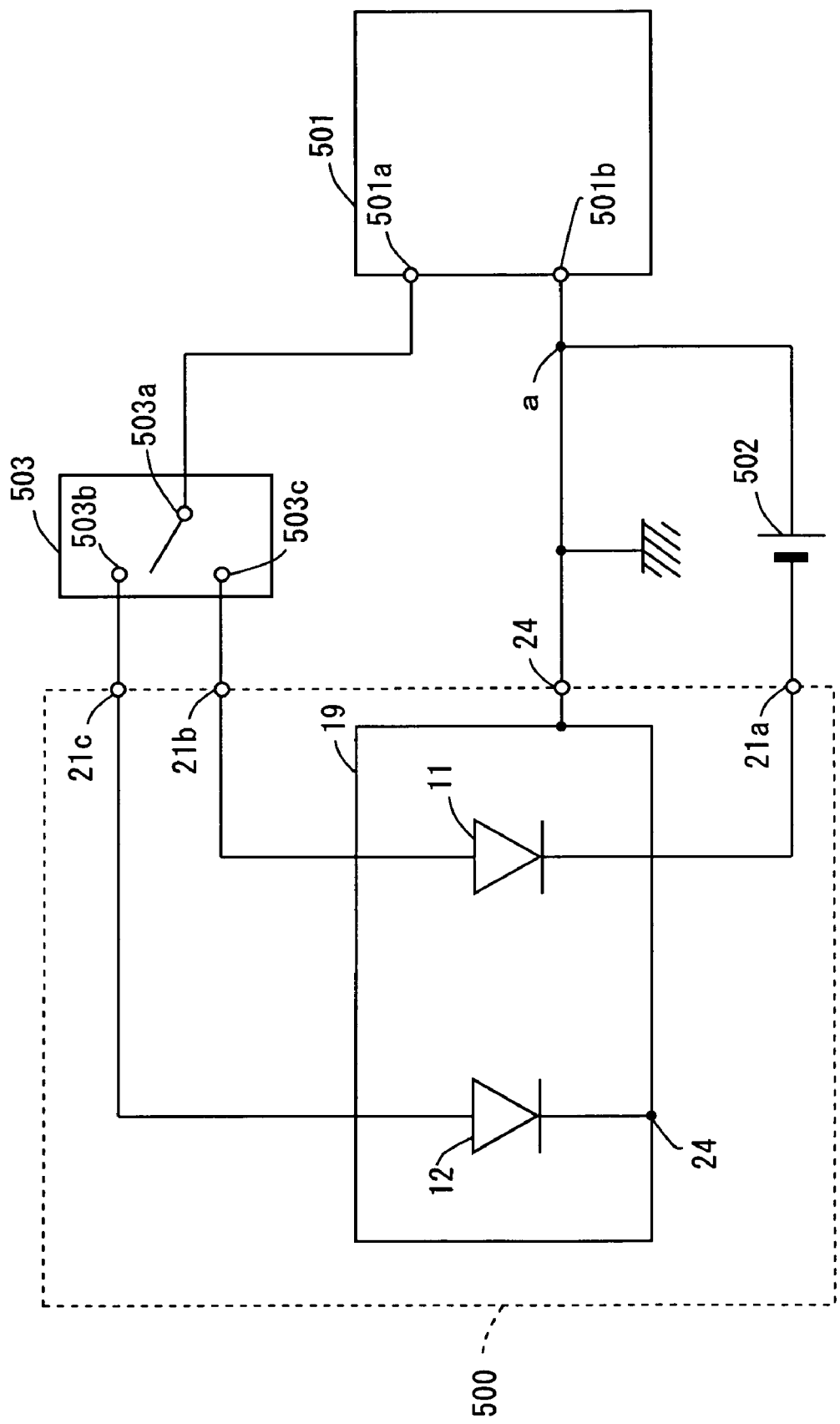
FIG. 5 is a circuit diagram showing electrical wiring of an optical apparatus using the semiconductor laser apparatus of FIG. 4.

Now refer to FIG. 5 which is a circuit diagram showing electrical wiring of an optical apparatus using the semiconductor laser apparatus 500 of FIG. 4.

As shown in FIG. 5, the optical apparatus comprises the semiconductor laser apparatus 500, a drive circuit 501, a dc (direct-current) power supply 502, and a switch 503.

The drive circuit 501 of FIG. 5 incorporates a dc power supply (not illustrated) that generates a dc voltage V. The dc voltage V is higher than the lasing threshold voltage of the second semiconductor laser device 12. The dc power supply 502 outputs a negative (reverse polarity) dc voltage −Va. An anode terminal 501a of the drive circuit 501 is connected to a terminal 503a of the switch 503. A terminal 503b of the switch 503 is connected to the power supply pin 21c in the semiconductor laser apparatus 500, while a terminal 503c is connected to the power supply pin 21b in the semiconductor laser apparatus 500.

A cathode terminal 501b of the drive circuit 501 is connected to a node a. The node a is connected to an anode side of the dc power supply 502, and also connected to the power supply pin 24 and to the package body 19 in the semiconductor laser apparatus 500. The node a is grounded (i.e., 0 V). A cathode side of the dc power supply 502 is connected to the power supply pin 21a in the semiconductor laser apparatus 500.

When the switch 503 is switched to the terminal 503b, the dc power supply incorporated in the drive circuit 501 applies the dc voltage V to the second semiconductor laser device 12. This enables the emission of a red laser beam from the second semiconductor laser device 12.

On the other hand, when the switch 503 is switched to the terminal 503c, the dc power supply incorporated in the drive circuit 501 applies the dc voltage V to the p-side pad electrode 11b of the first semiconductor laser device 11. Simultaneously, the dc power supply 502 applies the negative dc voltage −Va to the n-side electrode 11c of the first semiconductor laser device 11. This means that the first semiconductor laser device 11 receives a sum of the voltages V+Va, i.e., the dc voltage from the drive circuit 501 and the negative dc voltage from the dc power supply 502. This enables the emission of a blue-violet laser beam from the first semiconductor laser device 11.

When, for example, the lasing threshold voltage of the first semiconductor laser device 11 is 4 to 6 V, and the lasing threshold voltage of the second semiconductor laser device 12 is 2 to 2.5 V, it is preferred that the dc voltage V is set to 2 to 2.5 V, and the negative dc voltage −Va is set to −2 to −3 V.

Next, specific structures of the first semiconductor laser device 11 and the second semiconductor laser device 12 will be described. In the first embodiment, the first semiconductor laser device 11 is a semiconductor laser device that emits a blue-violet laser beam (hereinafter referred to as a blue-violet semiconductor laser device), and the second semiconductor laser device 12 is a semiconductor laser device that emits a red laser beam (hereinafter referred to as a red semiconductor laser device).

FIGS. 6(a) and 6(b) are schematic cross sections for use in illustrating the structure of the blue-violet semiconductor laser device 11 in detail. In FIGS. 6(a) and 6(b), three directions orthogonal to one another are defined as X-direction, Y-direction, and Z-direction, as indicated by arrows X, Y, Z. The X- and Y-directions are in parallel with a p-n junction surface of the blue-violet semiconductor laser device 11.

The blue-violet semiconductor laser device 11 has an n-type GaN substrate 11a formed on an n-side electrode 11c made of Ti/Pt/Au, and a GaN-based semiconductor layer with a layered structure formed on the n-type GaN substrate 11a.

As such GaN-based semiconductor layer, an n-GaN layer 101, n-AlGaN cladding layer 102, n-GaN optical guide layer 103, MQW (multi-quantum well) active layer 104, undoped AlGaN cap layer 105, undoped GaN optical guide layer 106, p-AlGaN cladding layer 107, and undoped GaInN contact layer 108 are formed in order on the n-type GaN substrate 11a, as shown in FIG. 6(a). Each of these layers is formed by MOCVD (metal organic chemical vapor deposition), for example.

The MQW active layer 104 has a structure composed of an alternate lamination of four undoped GaInN barrier layers 104a and three undoped GaInN well layers 140b, as shown in FIG. 6(b).

For example, the n-AlGaN cladding layer 102 has an Al composition of 0.15 and a Ga composition of 0.85, as shown in FIG. 6(a). The n-GaN layer 101, n-AlGaN cladding layer 102, and n-GaN optical guide layer 103 are each doped with Si.

The undoped GaInN barrier layer 104a has a Ga composition of 0.95 and an In composition of 0.05. The undoped GaInN well layer 104b has a Ga composition of 0.90 and an In composition of 0.10. The p-AlGaN cap layer 105 has an Al composition of 0.30 and a Ga composition of 0.70.

The p-AlGaN cladding layer 107 has an Al composition of 0.15 and a Ga composition of 0.85. The p-AlGaN cladding layer 107 is doped with Mg. The undoped GaInN contact layer 108 has a Ga composition of 0.95 and an In composition of 0.05.

The p-AlGaN cladding layer 107 has a stripe-like ridge portion Ri that extends in the X-direction. The ridge portion Ri in the p-AlGaN cladding layer 107 has a width of approximately 1.5 μm.

The undoped GaInN contact layer 108 is formed on the upper surface of the ridge portion Ri in the p-AlGaN cladding layer 107.

An insulating film 109 of SiO$_2$ is formed on the upper surface of the p-AlGaN cladding layer 107 and on the upper surface of the undoped GaInN contact layer 108, and then the portion of the insulating film 109 formed on the undoped GaInN contact layer 108 is etched away, followed by the formation of a p-electrode 110 of Pd/Pt/Au on the undoped GaInN contact layer 108 exposed outside. After this, a p-side pad electrode 11b is formed so as to cover the upper surface of the p-electrode 110 by sputtering, vacuum evaporation or electron beam evaporation.

In this manner, the GaN-based semiconductor layer is formed that has the laminated structure on one surface of the n-type GaN substrate 11a.

The blue-violet semiconductor laser device 11 has a blue-violet-beam-emission point formed at a position in the MQW active layer 104 below the ridge portion Ri.

Now refer to FIGS. 7(a) and 7(b) which are schematic cross sections for use in illustrating the structure of the red semiconductor laser device 12 in detail. In FIGS. 7(a) and 7(b) also, the X-, Y-, and Z-directions are defined similarly as in FIGS. 6(a) and 6(b).

In this embodiment, the red semiconductor laser device 12 has an n-type GaAs substrate 12a formed on an n-side electrode 12c made of AuGe/Ni/Au and an AlGaInP-based semiconductor layer formed on the n-type GaAs sbustrate 12a. The n-type GaAs substrate 12a is doped with Si.

As the semiconductor layer with a layered structure, an n-GaAs layer 201, n-AlGaInP cladding layer 202, undoped AlGaInP optical guide layer 203, MQW (multi-quantum well) active layer 204, undoped AlGaInP optical guide layer 205, p-AlGaInP first cladding layer 206, p-GaInP etching stop layer 207, p-AlGaInP second cladding layer 208, and p-GaInP contact layer 209 are formed in order on the n-type GaAs substrate 12a, as shown in FIG. 7(a). Each of these layers is formed by MOCVD (metal organic chemical vapor deposition), for example.

The MQW active layer 204 has a structure composed of an alternate lamination of two undoped AlGaInP barrier layers 204a and three undoped GaInP well layers 204b, as shown in FIG. 7(b).

For example, the n-AlGaInP cladding layer 202 has an Al composition of 0.70, a Ga composition of 0.30, an In composition of 0.50, and a P composition of 0.50, as shown in FIG. 7(a) The n-GaAs layer 201 and the n-AlGaInP cladding layer 202 are each doped with Si.

The undoped AlGaInP optical guide layer 203 has an Al composition of 0.50, a Ga composition of 0.50, an In composition of 0.50, and a P composition of 0.50.

The undoped AlGaInP barrier layer 204a has an Al composition of 0.50, a Ga composition of 0.50, an In composition of 0.50, and a P composition of 0.50. The undoped GaInP well layer 204b has an In composition of 0.50 and a Ga composition of 0.50. The undoped AlGaInP optical guide layer 205 has an Al composition of 0.50, a Ga composition of 0.50, an In composition of 0.50, and a P composition of 0.50.

The p-AlGaInP first cladding layer 206 has an Al composition of 0.70, a Ga composition of 0.30, an In composition of 0.50, and a P composition of 0.50. The p-GaInP etching stop layer 207 has an In composition of 0.50 and a Ga composition of 0.50.

Note that the composition of the above-described AlGaInP-based materials may be represented by a general formula $(Al_a Ga_b)_{0.5} In_c P_d$, wherein b is the Ga composition, c is the In composition, and d is the P composition.

The p-AlGaInP second cladding layer 208 has an Al composition of 0.70, a Ga composition of 0.30, an In composition of 0.50, and a P composition of 0.50. The p-contact layer 209 has a layered structure of a p-GaInP layer and a p-GaAs layer. The p-GaInP has a Ga composition of 0.5 and an In composition of 0.5.

The p-GaInP and p-GaAs in each of the p-AlGaInP first cladding layer 206, p-GaInP etching stop layer 207, p-AlGaInP second cladding layer 208, and p-contact layer 209 are doped with Zn.

The above-described p-AlGaInP second cladding layer 208 is formed only on a portion (i.e., central portion) of the p-GaInP etching stop layer 207. Then, the p-contact layer 209 is formed on the upper surface of the p-AlGaInP second cladding layer 208.

In this manner, the p-AlGaInP second cladding layer 208 and the p-contact layer 209 of the AlGaInP-based semiconductor layer form a stripe-like ridge portion Ri that extends in the X-direction. The ridge portion Ri formed by the p-AlGaInP second cladding layer 208 and the p-contact layer 209 has a width of approximately 2.5 μm.

An insulating film 210 of SiO$_2$ is formed on the upper surface of the p-GaInP etching stop layer 207, on the sides of the p-AlGaInP second cladding layer 208, and on the upper surface and sides of the p-contact layer 209, and then the portion of the insulating film 201 formed on the p-contact layer 209 is etched away, followed by the formation of a p-electrode 211 of Cr/Au on the p-contact layer 209 exposed outside. After this, a p-side pad electrode 12b is formed so as to cover the upper surface of the p-electrode 211 by sputtering, vacuum evaporation or electron beam evaporation.

In this manner, the AlGaInP-based semiconductor layer is formed which has the layered structure on one surface of the n-type GaAs substrate 12a.

The red semiconductor laser device 12 has a red-beam-emission point at a position in the MQW active layer 204 below the ridge portion Ri.

Next, a method of reducing the effect of aberration in the first semiconductor laser device 11 will be described.

Figure 8:
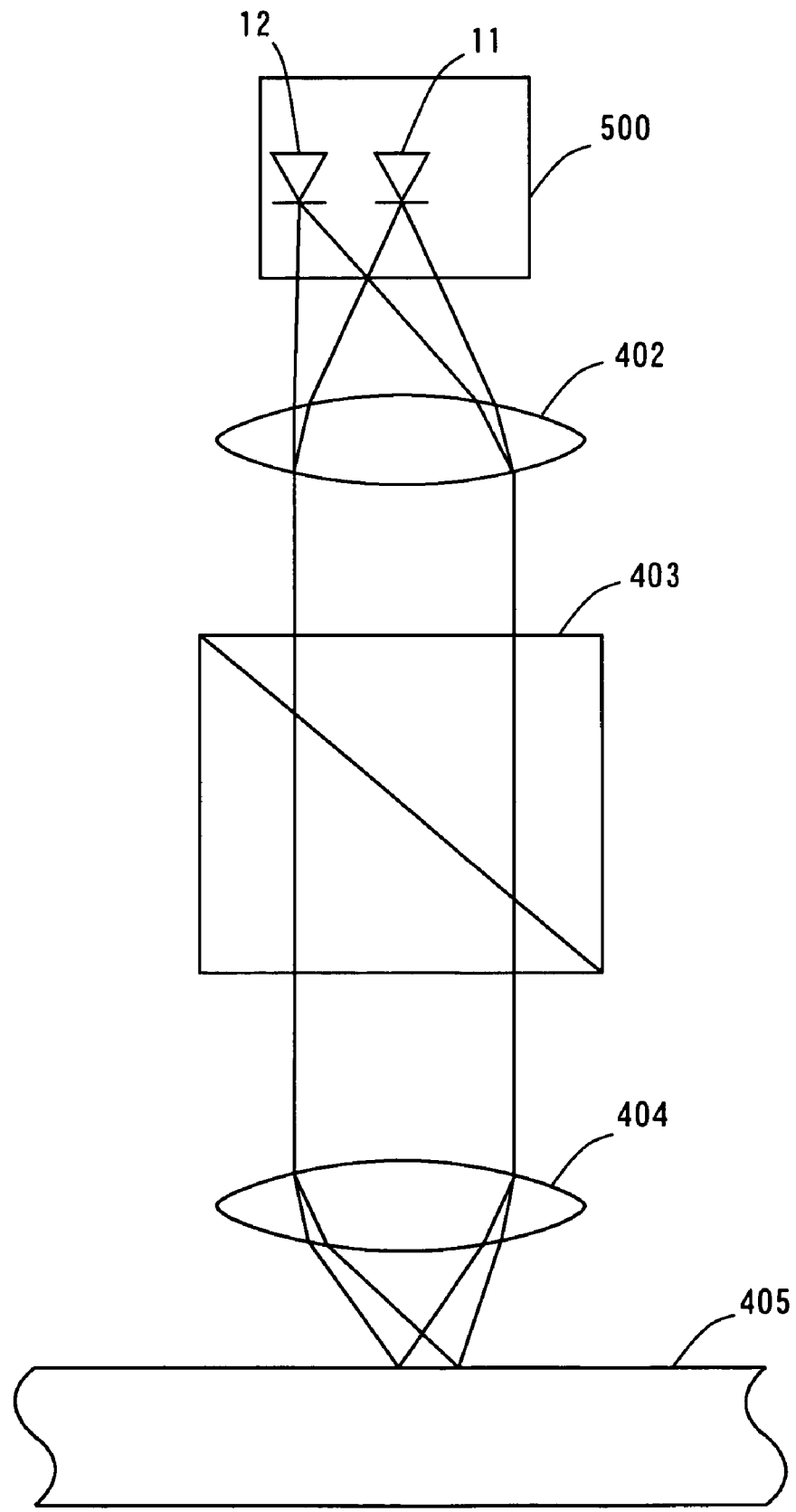
FIG. 8 is an explanatory diagram showing the semiconductor laser apparatus of the first embodiment used in a pickup for an optical disk system as an example of optical apparatuses.

FIG. 8 is an explanatory diagram showing the semiconductor laser apparatus 500 of the first embodiment used in a pickup for an optical disk system as an example of optical apparatuses.

As shown in FIG. 8, a blue-violet laser beam and a red laser beam which are emitted from the first semiconductor laser device 11 and the second semiconductor laser device 12, respectively, of the semiconductor laser apparatus 500 pass through a coupling lens 402, a beam splitter 403, and an objective lens 404, and then focused on a target object, i.e., an optical disk 405.

In this case, the blue-violet laser beam emitted from the first semiconductor laser device 11 passes through substantially the central portion of each of the coupling lens 402 and objective lens 404. This minimizes the effect of aberrations caused by the coupling lenses (mainly spherical abberations), so that the light utilization efficiency is enhanced, and the blue-violet laser beam is focused on the optical disk 405 with a minimal spot diameter. Consequently, the high density recording optical disk is capable of being recorded and played back.

On the other hand, the red laser beam emitted from the second semiconductor laser device 12 passes through the peripheral portion of each of the coupling lens 402 and objective lens 404. Although this may result in aberrations caused by the lenses (mainly spherical aberrations), the effect of aberrations hardly manifests itself because of a large spot diameter.

As described above, in the semiconductor laser apparatus 500 of the first embodiment, the p-side pad electrode 11b of the first semiconductor laser device 11 is connected with the drive circuit 501 that generates a positive potential, and the n-side electrode 11c of the first semiconductor laser device 11 is connected with the dc power supply 502 that generates a negative potential. In this manner, a voltage higher than the lasing threshold voltage of the first semiconductor laser device 11 can be applied to the first semiconductor laser device 11.

Accordingly, the first semiconductor laser device 11 and the second semiconductor laser device 12 with different lasing wavelengths are allowed to drive with the drive circuit 501 that generates low voltages, by switching the first semiconductor laser device 11 and the second semiconductor laser device 12.

Moreover, the electrical insulation of the first semiconductor laser device 11 from the package body 19 decreases the parasitic capacitance due to the package body 19, allowing the first semiconductor laser device 11 to operate at high frequency. Meanwhile, the electrical connection of the n-side electrode 12c of the second semiconductor laser device 12 with the package body 19 obviates the necessity of providing a wire for the n-side electrode 12 of the second semiconductor laser device 12 to be grounded.

In addition, the first semiconductor laser device 11 made of a material that includes a nitride semiconductor is capable of emission of a blue-violet laser beam having a lasing wavelength shorter than that of the red laser beam that is emitted by the second semiconductor laser device 12. Furthermore, the central portion of the package body 19 is positioned on the central portions of the coupling lens 402, beam splitter 403, and objective lens 404, so that the blue-violet laser beam emitted from the first semiconductor laser device 11 with a wavelength shorter than that for the second semiconductor laser device 12 passes through the central portions of the coupling lens 402 and objective lens 404, and focused on the target object. Consequently, the effect of aberrations caused by the coupling lens 402 and the objective lens 404 (mainly spherical aberrations) is reduced, allowing for convergence of a laser beam having a microspot. As a result, the blue-violet laser beam having a microspot diameter enables increased density and capacity in the optical disk system.

Moreover, in the layered structures of the first semiconductor laser device 11 and the second semiconductor laser device 12, respectively, the MWQ active layers 104, 204 and the ridge portions Ri, which are the heat generating portions, are located nearer to the p-side pad electrodes 11b, 12b than the n-side electrodes 11c, 12c. Accordingly, bonding the p-side pad electrodes 11b, 12b to the respective metallic layers 16a, 16b sides on the submount 15 allows the heat from the heat generating portions to be efficiently dissipated from the p-side pad electrodes 11b, 12b, via the high thermal conductive metallic layers 16a, 16b and the submount 15.

Second Embodiment

A semiconductor laser apparatus according to a second embodiment and an optical apparatus therefor will hereinafter be described. The semiconductor laser apparatus of the second embodiment differs from the semiconductor laser apparatus of the first embodiment, as will be described below.

Figure 9:
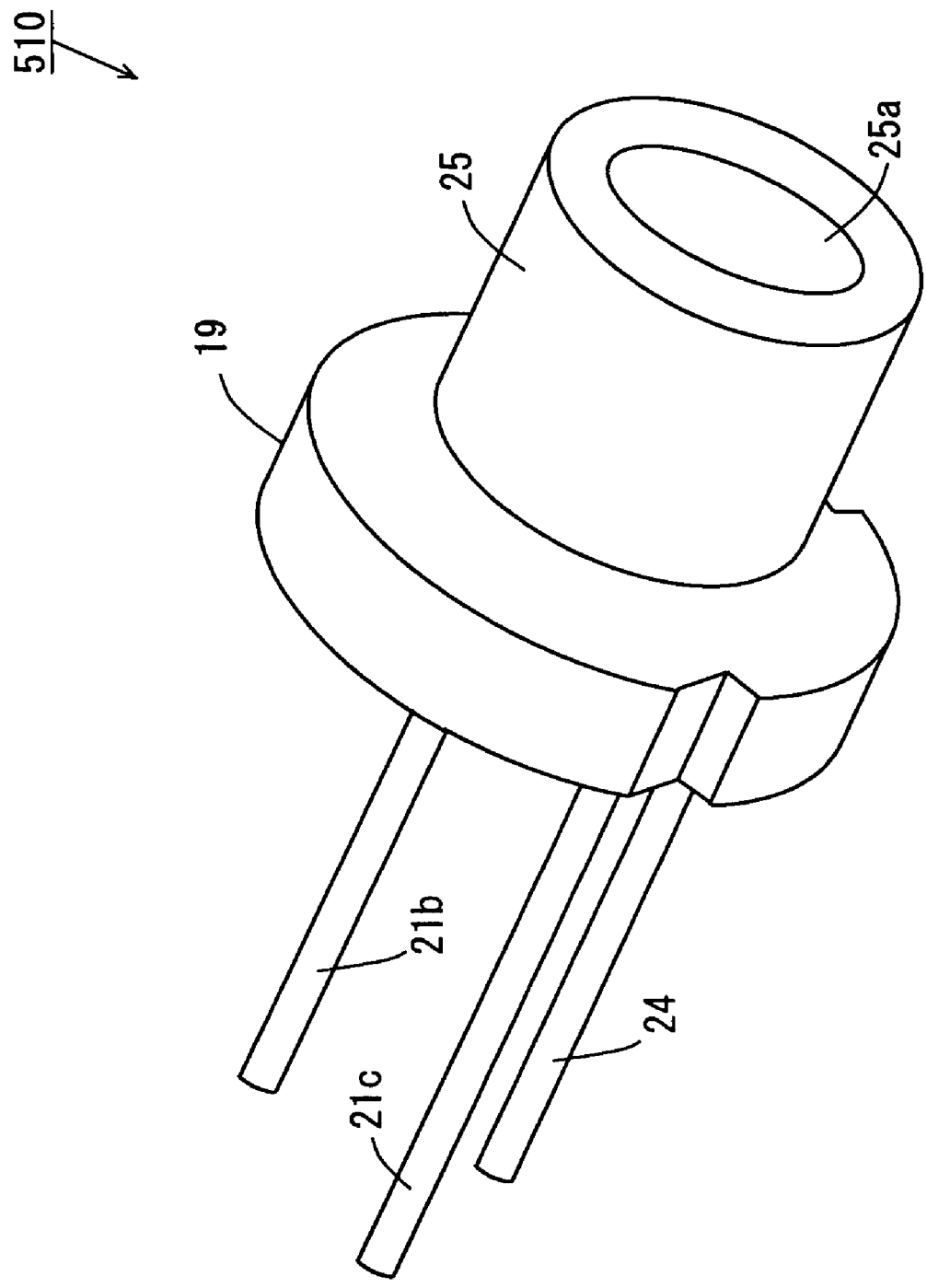
FIG. 9 is an external perspective view showing a semiconductor laser apparatus according to a second embodiment.

FIG. 9 is an external perspective view showing the semiconductor laser apparatus according to the second embodiment.

The semiconductor laser apparatus 501 shown in FIG. 9 comprises power supply pins 21b, 21c, 24 instead of the power supply pins 21a to 21c, 24 in the semiconductor laser apparatus 500 of FIG. 1.

Next, an inside of the package body 19 of the semiconductor laser apparatus 510 of the second embodiment will be described. The direction in which the semiconductor laser devices emit laser beams is defined as a front side.

Figure 10:
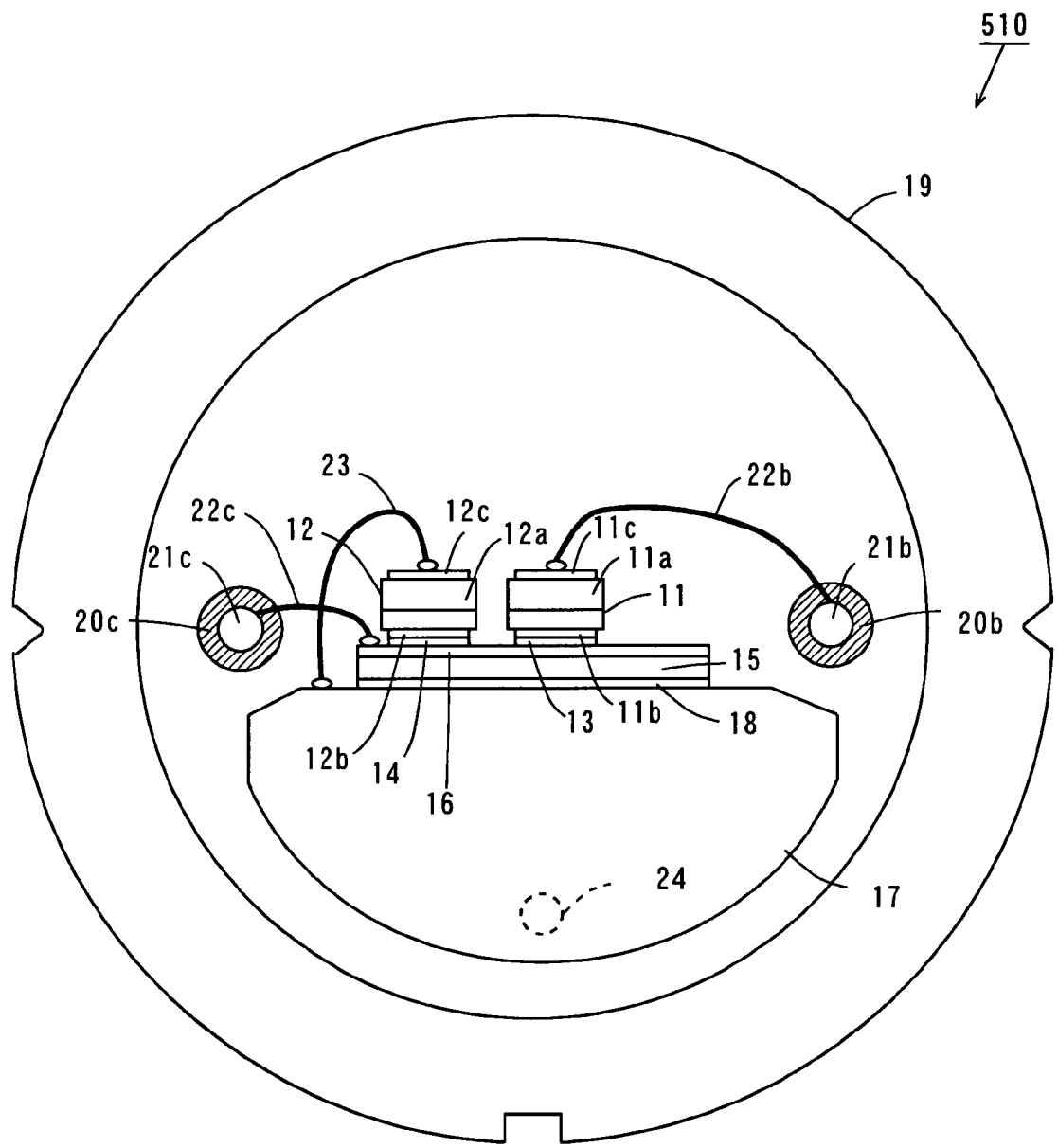
FIG. 10 is a schematic front view showing the semiconductor laser apparatus of FIG. 9 from which the cap has been removed.
Figure 11:
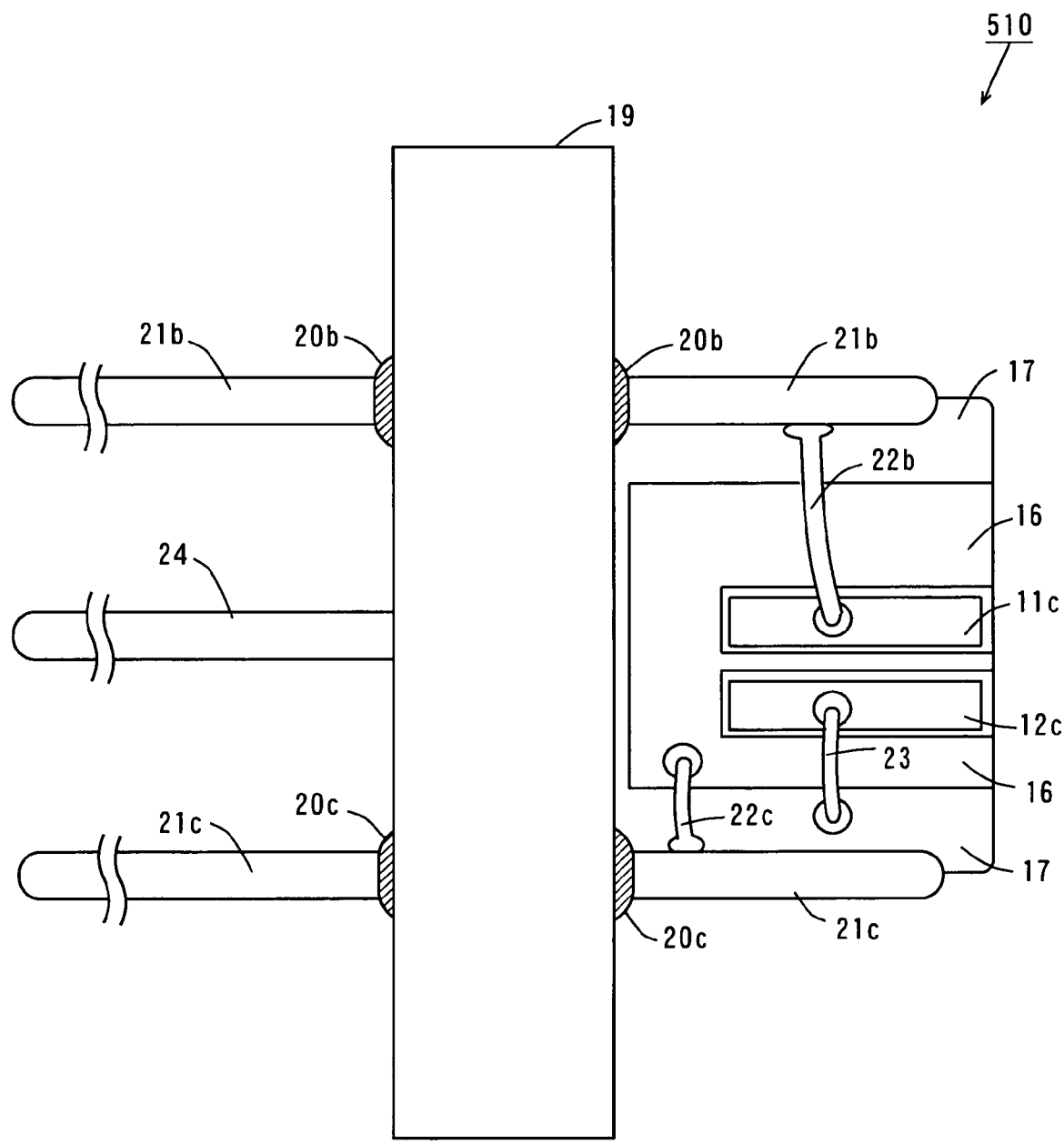
FIG. 11 is a schematic top view showing the semiconductor laser apparatus of FIG. 9 from which the cap has been removed.

FIG. 10 is a schematic front view showing the semiconductor laser apparatus 510 of FIG. 9 from which the cap 25 has been removed. FIG. 11 is a schematic top view showing the semiconductor laser apparatus of FIG. 9 from which the cap 25 has been removed.

The semiconductor laser apparatus 510 shown in FIG. 10 has a metallic layer 16 on the submount 15 instead of the metallic layers 16a, 16b and the gap 16c in the semiconductor laser apparatus 500 shown in FIG. 2.

The semiconductor laser apparatus 510 shown in FIG. 10 additionally comprises insulating rings 20b, 20c, power supply pins 21b, 21c, 24, and wires 22b, 22c, 23 instead of the insulating rings 20a to 20c, power supply pins 21a to 21c, 24, and wires 22a to 22c, 23 in the semiconductor laser apparatus 500 shown in FIG. 2.

In the semiconductor laser apparatus 510 of the second embodiment, the metallic layer 16 is electrically connected with the power supply pin 21c through the wire 22c, as shown in FIGS. 10 and 11. The power supply pin 21c is electrically isolated from the package body 19 through the insulating ring 20c.

The n-side electrode 11c of the first semiconductor laser device 11 is electrically connected with the power supply pin 21b through the wire 22b. The power supply pin 21b is electrically isolated from the package body 19 through the insulating ring 20b. The n-side electrode 12c of the second semiconductor laser device 12 is electrically connected to the support base 17 through the wire 23. This results in a structure that the n-side electrode 12c of the second semiconductor laser device 12 can receive power from the power supply pin 24 which is connected to the package body 19. The wires 22b, 22c, 23 are each made of Au (gold). Note that the first semiconductor laser device 11 and the second semiconductor laser device 12 are similar in structure to the first semiconductor laser device 11 and the second semiconductor laser device 12 shown in FIGS. 6 and 7.

Now refer to FIG. 12 which is a circuit diagram showing electrical wiring of the semiconductor laser apparatus 510.

As shown in FIG. 12, the p-side pad electrode 11b of the first semiconductor laser device 11 and the p-side pad electrode 12b of the second semiconductor laser device 12 are electrically connected through the metallic layer 16, which, in turn, is connected to the power supply pin 21c. The n-side electrode 11c of the first semiconductor laser device 11 is electrically isolated from the package body 19. The n-side electrode 11c of the first semiconductor laser device 11 is connected to the power supply pin 21b. The n-side electrode 12c of the second semiconductor laser device 12 is electrically connected to the package body 19.

Figure 13:
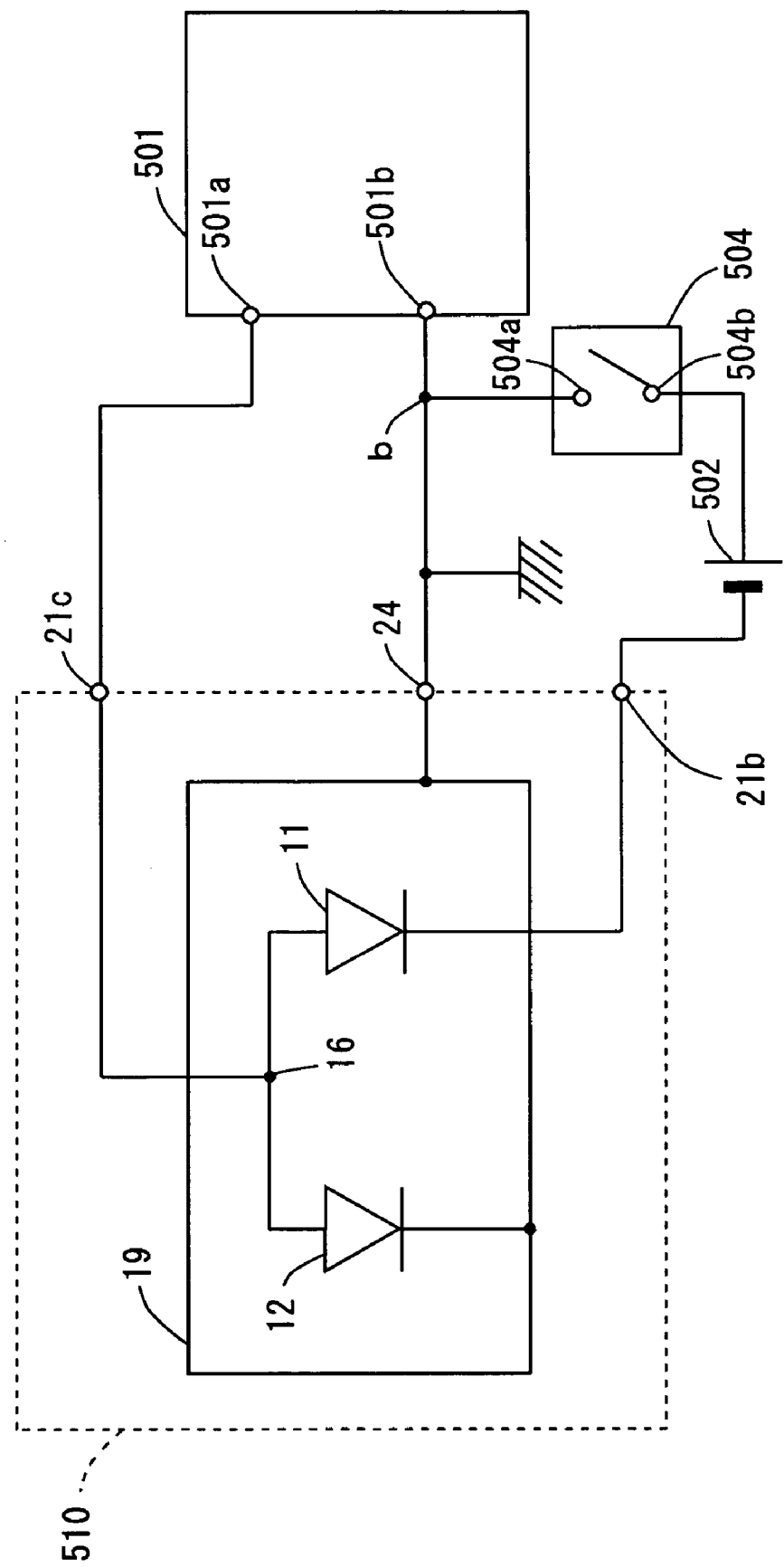
FIG. 13 is a circuit diagram showing electrical wiring of an optical apparatus using the semiconductor laser apparatus of FIG. 12.

Now refer to FIG. 13 which is a circuit diagram showing electrical wiring of an optical apparatus using the semiconductor laser apparatus 510 of FIG. 12.

As shown in FIG. 13, the optical apparatus comprises the semiconductor laser apparatus 510, a drive circuit 501, a dc power supply 502, and a switch 504.

The drive circuit 501 of FIG. 13 incorporates a dc power supply (not illustrated) that generates a dc voltage V. The dc voltage V is higher than the lasing threshold voltage of the second semiconductor laser device 12. The dc power supply 502, on the other hand, outputs a negative (reverse polarity) dc voltage −Va. An anode terminal 501a of the drive circuit 501 is connected to the power supply pin 21c in the semiconductor laser apparatus 510. A cathode terminal 501b of the drive circuit 501 is connected to a node b. The node b is connected to a terminal 504a of the switch 504, and also connected to the power supply pin 24 and the package body 19 in the semiconductor laser apparatus 510. The node b is grounded (0 V).

An anode side of the dc power supply 502 is connected to a terminal 504b of the switch 504. A cathode side of the dc power supply 502 is connected to the power supply pin 21b in the semiconductor laser apparatus 510.

When the switch 504 is switched off, the dc power supply incorporated in the drive circuit 501 applies the dc voltage V to the second semiconductor laser device 12. This allows the second semiconductor laser device 12 to emit a red laser beam.

When, on the other hand, the switch 504 is switched on, the dc power supply incorporated in the drive circuit 501 applies the dc voltage V to the p-side pad electrode 11b of the first semiconductor laser device 11. Simultaneously, the dc power supply 502 applies the negative dc voltage −Va to the n-side electrode 11c of the first semiconductor laser device 11. This means that the first semiconductor laser device 11 receives a sum of the voltages V+Va, i.e., the dc voltage from the drive circuit 501 and the negative dc voltage from the dc power supply 502. This allows the first semiconductor laser device 11 to emit a blue-violet laser beam.

For example, when the lasing threshold voltage of the first semiconductor laser device 11 is 4 to 6 V, and the lasing threshold voltage of the second semiconductor laser device 12 is 2 to 2.5 V, it is preferred that the dc voltage V is set to 2 to 2.5 V, and the negative dc voltage −Va is set to −3 to −4 V.

In this case, the first semiconductor laser device 11 is allowed to drive within a range in which the difference between the voltage supplied to the first semiconductor laser device 11 and the absolute value of the negative dc voltage −Va is not greater than a voltage at which a current starts to flow in the second semiconductor laser device 17 (which is approximately 1.7 V). In this case, the second semiconductor laser device 12 does not emit a laser beam.

According to the foregoing, the number of power supply pins in the semiconductor laser apparatus 510 of the second embodiment and in the optical apparatus can be smaller than that in the semiconductor laser apparatus 500 of the first embodiment.

Moreover, using the drive circuit 501 that enables driving the second semiconductor laser device 12 with a low lasing threshold voltage, the first semiconductor laser device 11 with a high lasing threshold voltage is allowed to drive by switching the switch 504.

Third Embodiment

A semiconductor laser apparatus according to a third embodiment and an optical apparatus therefor will hereinafter be described. The semiconductor laser apparatus of the third embodiment differs from the semiconductor laser apparatus of the first embodiment, as will be described below.

Figure 14:
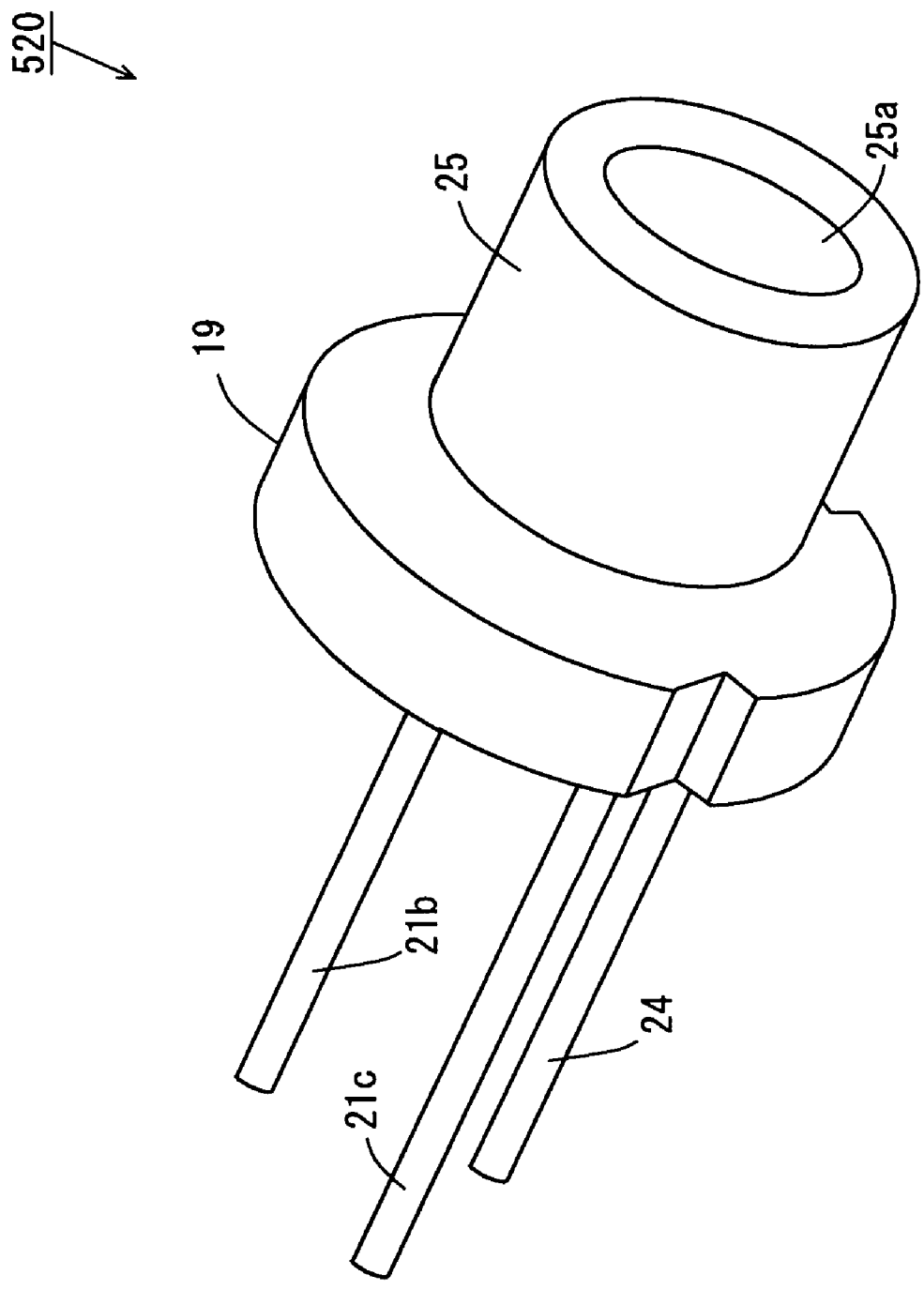
FIG. 14 is an external perspective view showing a semiconductor laser apparatus according to a third embodiment.

FIG. 14 is an external perspective view showing the semiconductor laser apparatus according to the third embodiment.

The semiconductor laser apparatus 520 shown in FIG. 14 comprises power supply pins 21b, 21c, 24 instead of the power supply pins 21a, 21b, 21c, 24 in the semiconductor laser apparatus 500 of FIG. 1.

An inside of the package body 19 of the semiconductor laser apparatus 520 of the third embodiment will now be described. The direction in which the semiconductor laser devices emit laser beams is defined as a front side.

Figure 15:
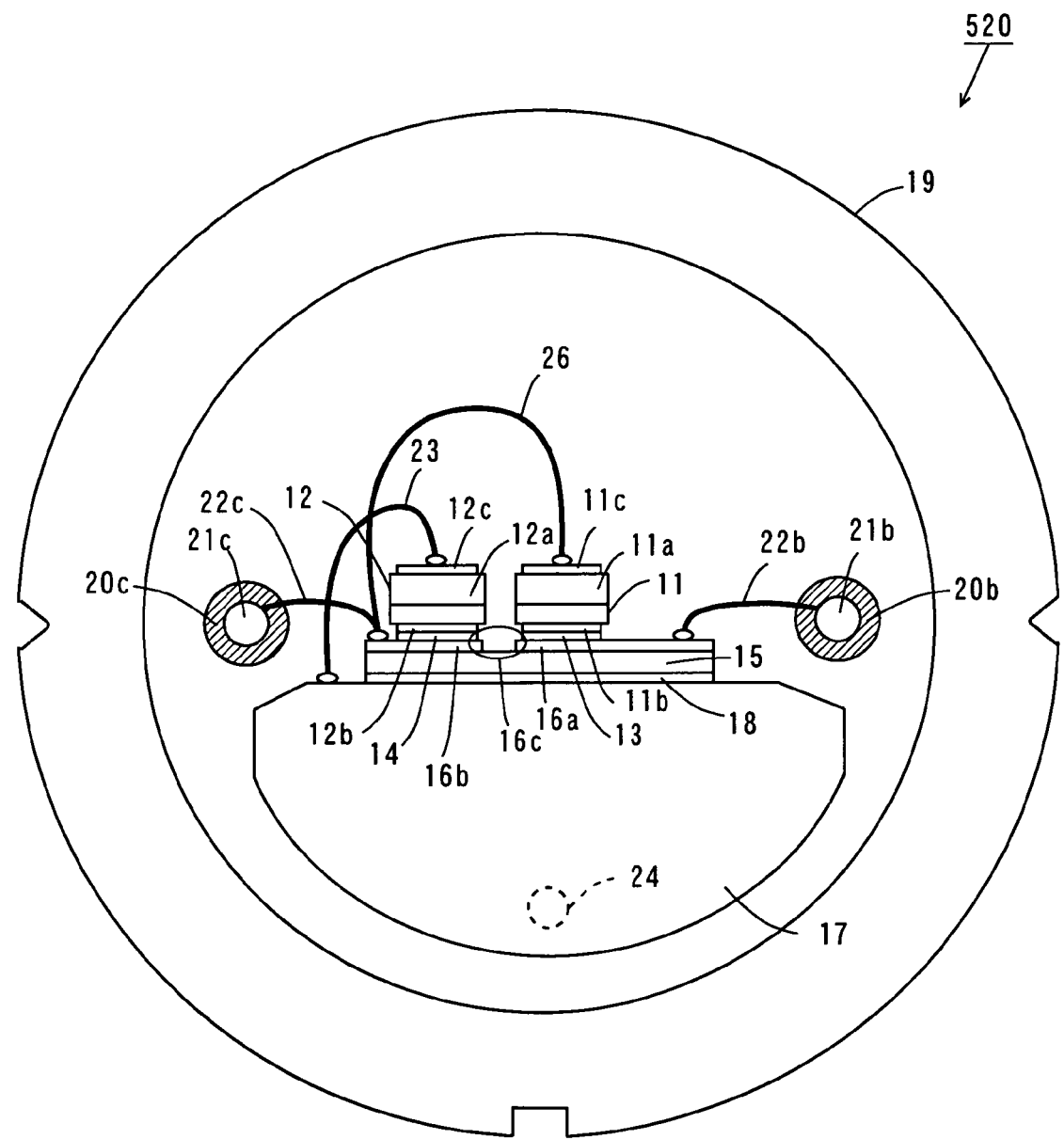
FIG. 15 is a schematic front view showing the semiconductor laser apparatus of FIG. 14 from which the cap has been removed.
Figure 16:
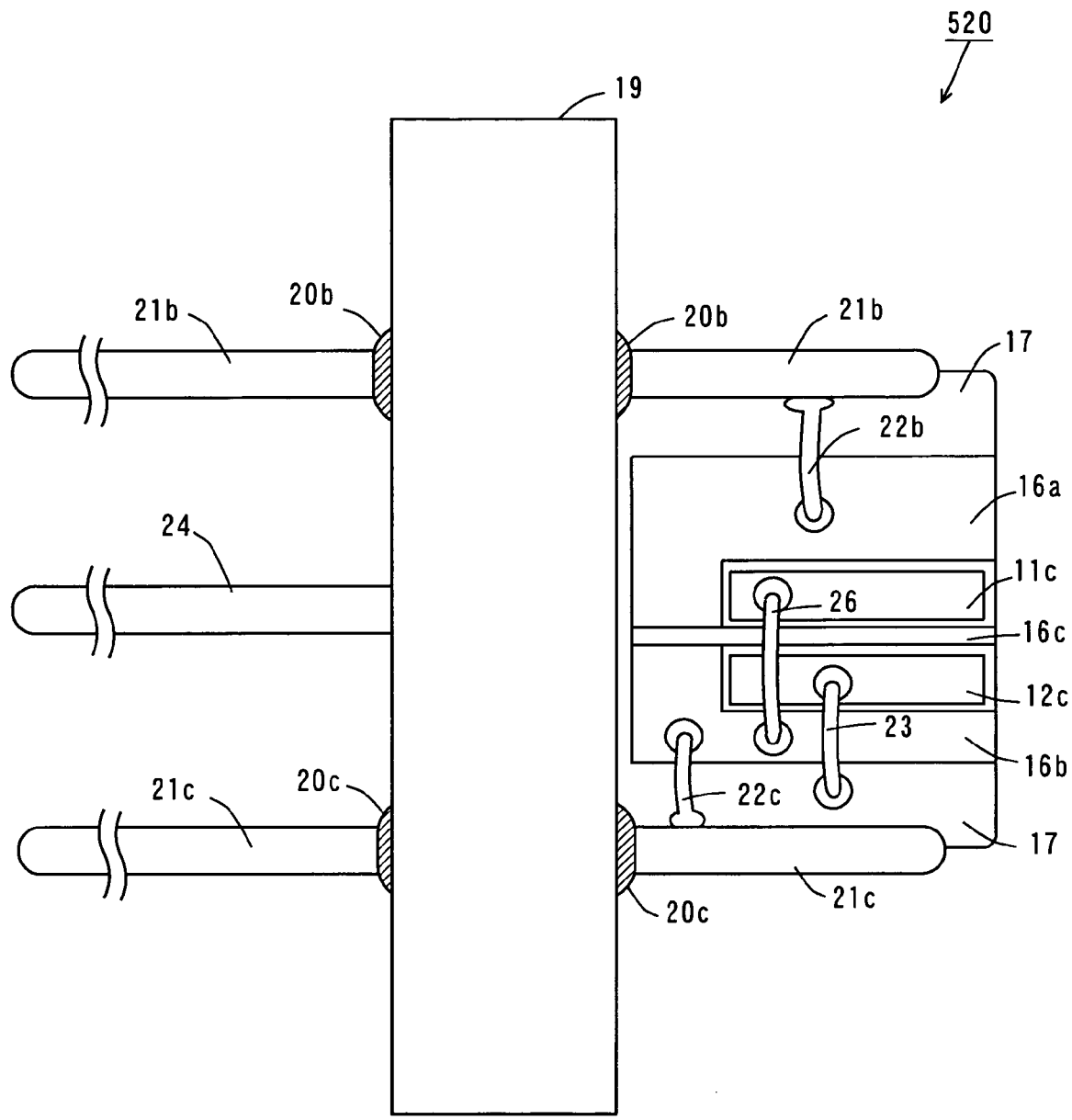
FIG. 16 is a schematic top view showing the semiconductor laser apparatus of FIG. 14 from which the cap has been removed.

FIG. 15 is a schematic front view showing the semiconductor laser apparatus 520 of FIG. 14 from which the cap 25 has been removed. FIG. 16 is a schematic top view showing the semiconductor laser apparatus 520 of FIG. 14 from which the cap 25 has been removed.

The semiconductor laser apparatus 520 shown in FIG. 15 comprises insulating rings 20b, 20c, power supply pins 21b, 21c, 24, and wires 22b, 22c, 23, 26 instead of the insulating rings 20a to 20c, power supply pins 21a to 21c, 24, and wires 22a to 22c, 23 in the semiconductor laser apparatus 500 of FIG. 2.

In the semiconductor laser apparatus 520 of the third embodiment, a metallic layer 16a is electrically connected with the power supply pin 21b through the wire 22b, as shown in FIGS. 15 and 16. The power supply pin 21b is electrically isolated from the package body 19 through the insulating ring 20b. A metallic layer 16b is electrically connected with the power supply pin 21c through the wire 22c. The power supply pin 21c is electrically isolated from the package body 19 through the insulating ring 20c. The metallic layer 16b is electrically connected also with the n-side electrode 11c of the first semiconductor laser device 11 through the wire 26. The n-side electrode 12c of the second semiconductor laser device 12 is electrically connected to the support base 17 through the wire 23. This results in a structure in which the n-side electrode 12c of the second semiconductor laser device 12 can receive power from the power supply pin 24 which is connected to the package body 19. The wires 22b, 22c, 23, 26 are each made of Au (gold). Note that the first semiconductor laser device 11 and the second semiconductor laser device 12 are similar in structure to the first semiconductor laser device 11 and the second semiconductor laser device 12 shown in FIGS. 6 and 7.

Figure 17:
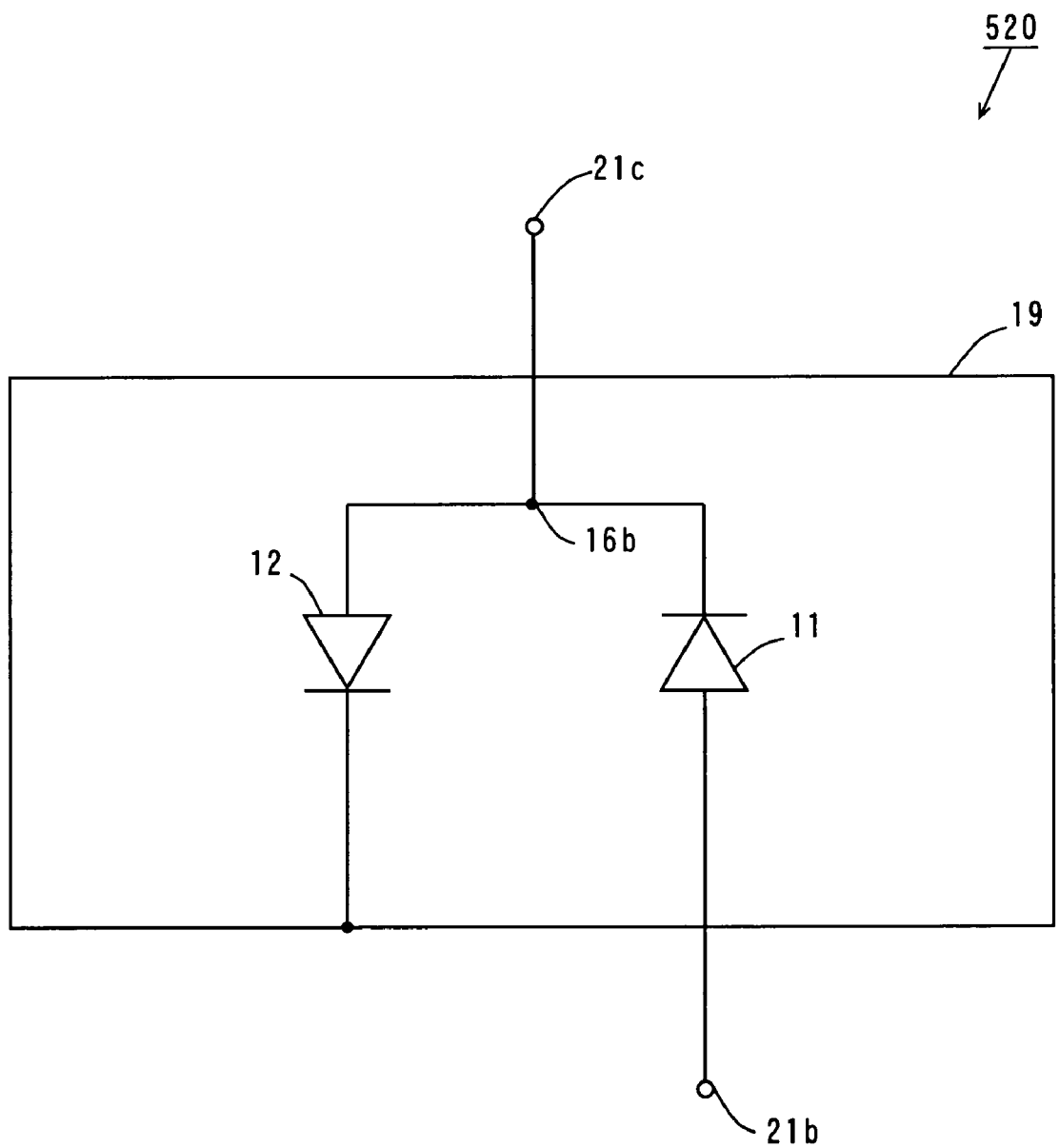
FIG. 17 is a circuit diagram showing electrical wiring of the semiconductor laser apparatus.

Now refer to FIG. 17 which is a circuit diagram showing electrical wiring of the semiconductor laser apparatus 520.

As shown in FIG. 17, the n-side electrode 11c of the first semiconductor laser device 11 and the p-side pad electrode 12b of the second semiconductor laser device 12 are electrically connected through the metallic layer 16b, which, in turn, is connected to the power supply pin 21c.

The p-side pad electrode 11b and the n-side electrode 11c of the first semiconductor laser device 11 are electrically isolated from the package body 19. The p-side pad electrode 11b of the first semiconductor laser device 11 is connected to the power supply pin 21b, while the n-side electrode 11c is connected to the power supply pin 21c.

On the other hand, the p-side pad electrode 12b of the second semiconductor laser device is electrically connected with the metallic layer 16b, and the n-side electrode 12c is electrically connected with the package body 19.

Figure 18:
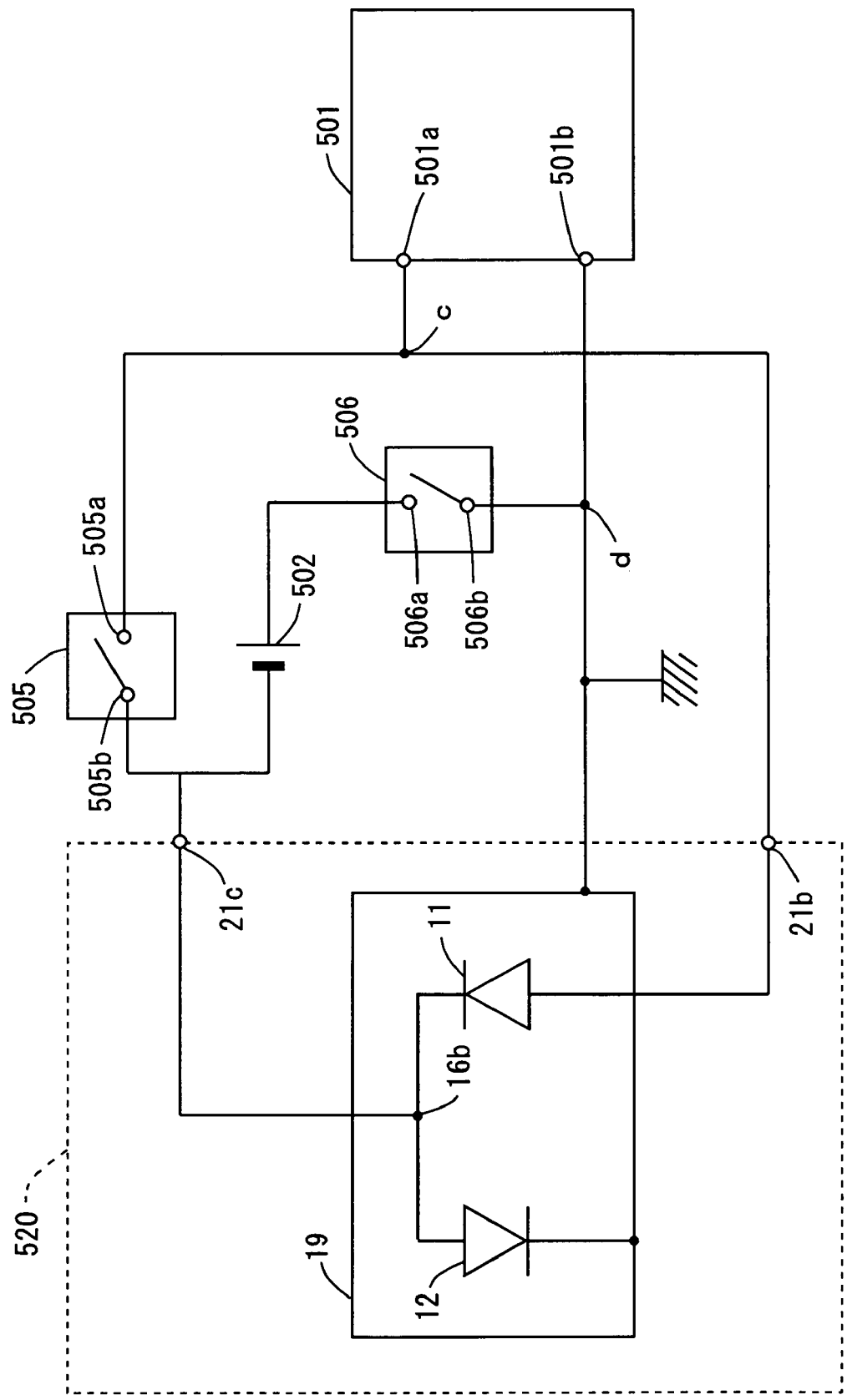
FIG. 18 is circuit diagram showing electrical wiring of an optical apparatus using the semiconductor laser apparatus of FIG. 17.

Now refer to FIG. 18 which is a circuit diagram showing electrical wiring of an optical apparatus using the semiconductor laser apparatus 520 of FIG. 17.

The optical apparatus comprises the semiconductor laser apparatus 520, a drive circuit 501, a dc power supply 502, and switches 505, 506, as shown in FIG. 18.

The drive circuit 501 of FIG. 18 incorporates a dc power supply (not illustrated) that generates a dc voltage V. The dc voltage V is higher than the lasing threshold voltage of the second semiconductor laser device 12. The dc power supply 502 outputs a negative (reverse polarity) dc voltage −Va. An anode terminal 501a of the drive circuit 501 is connected to a node c. The node c is connected to a terminal 505a of the switch 505, and also connected to the power supply pin 21b in the semiconductor laser apparatus 520.

A cathode terminal 501b of the drive circuit 501 is connected to a node d. The node d is connected to a terminal 506b of the switch 506, and also connected to the power supply pin 24 and the package body 19 in the semiconductor laser apparatus 520. The node d is grounded (0 V).

The power supply pin 21c in the semiconductor laser apparatus 520 is connected to a terminal 505b of the switch 505 and to a cathode side of the dc power supply 502. An anode side of the dc power supply 502 is connected to a terminal 506a of the switch 506.

When the switch 505 is switched on, and simultaneously the switch 506 is switched off, the dc power supply incorporated in the drive circuit 501 applies the dc voltage V to the second semiconductor laser device 12. This allows the second semiconductor laser device 12 to emit a red laser beam.

When, on the other hand, the switch 505 is switched off, and simultaneously the switch 506 is switched on, the dc power supply incorporated in the drive circuit 501 applies the dc voltage v to the p-side pad electrode 11b of the first semiconductor laser device 11. At the same time, the dc power supply 502 applies the negative dc voltage −Va to the n-side electrode 11c of the first semiconductor laser device 11. This means that the first semiconductor laser device 11 receives a sum of the voltages V+Va, i.e., the dc voltage from the drive circuit 501 and the negative dc voltage from the dc power supply 502. This allows the first semiconductor laser device 11 to emit a blue-violet laser beam.

When, for example, the lasing threshold voltage of the first semiconductor laser device 11 is 4 to 6 V, and the lasing threshold voltage of the second semiconductor laser device 12 is 2 to 2.5 V, it is preferred that the dc voltage V is set to 2 to 2.5 V, and the negative dc voltage −Va is set to −2 to −3V.

According to the foregoing, in the semiconductor laser apparatus 520 of the third embodiment, a voltage of the reverse polarity is applied to the second semiconductor laser device 12 during driving of the first semiconductor laser device 11 within a range not exceeding the reverse breakdown voltage of the second semiconductor laser device 12. This obviates the necessity of adjusting the voltage for the second semiconductor laser device 12 during driving of the first semiconductor laser device 11, allowing the first semiconductor laser device 11 to be driven completely independently.

Moreover, the number of power supply pins in the semiconductor laser apparatus 520 of the third embodiment can be smaller than that in the semiconductor laser apparatus 500 of the first embodiment.

In addition, in the semiconductor laser apparatus 520 of the third embodiment, using the drive circuit 501 that enables driving the second semiconductor laser device 12 with a low lasing threshold voltage, the first semiconductor laser device 11 with a high lasing threshold voltage is allowed to drive by switching the switches 505, 506.

Fourth Embodiment

A semiconductor laser apparatus according to a fourth embodiment and an optical apparatus therefor will hereinafter be described. The semiconductor laser apparatus of the fourth embodiment differs from the semiconductor laser apparatus of the first embodiment, as will be described below.

Figure 19:
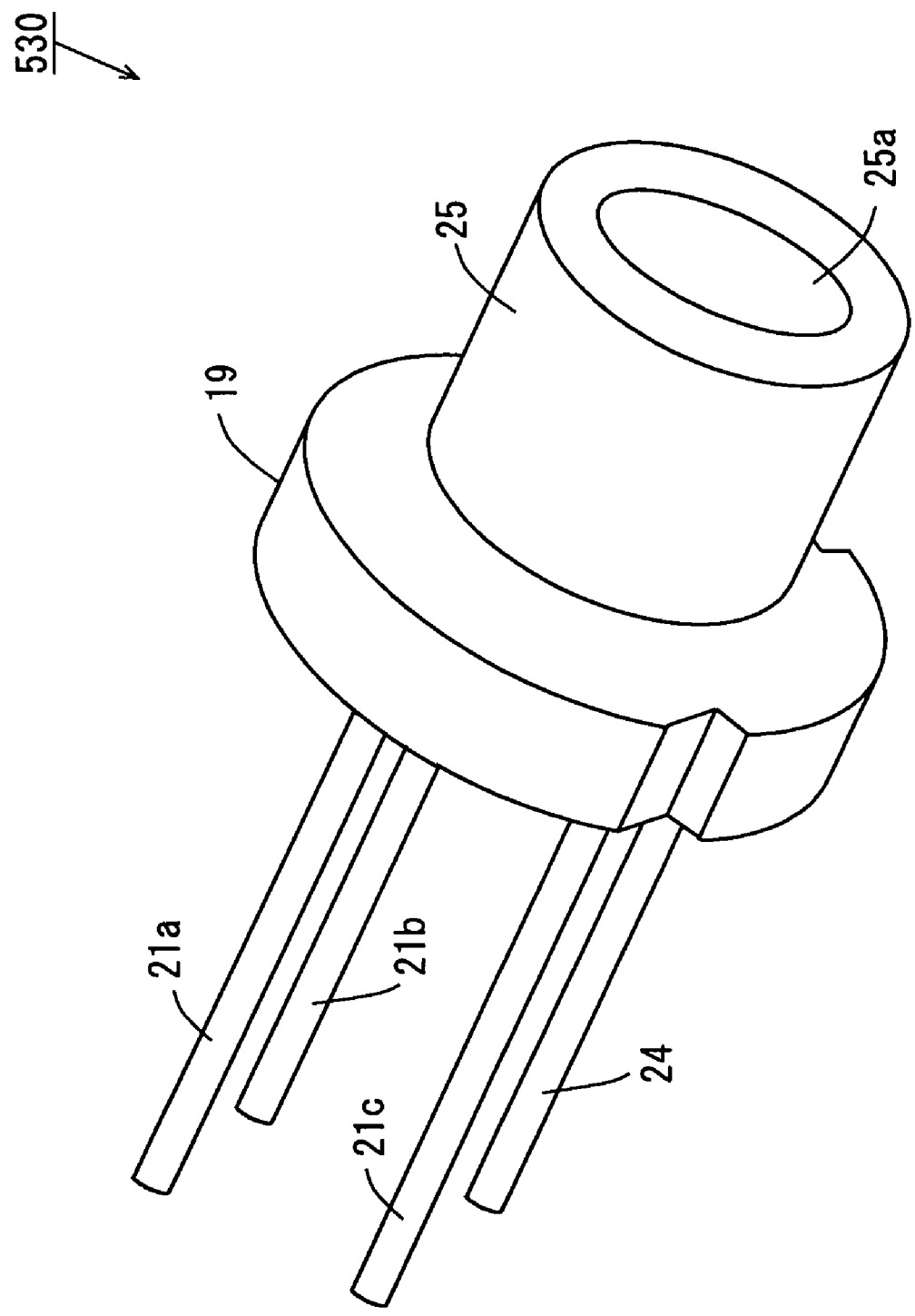
FIG. 19 is an external perspective view showing a semiconductor laser apparatus according to a fourth embodiment.

FIG. 19 is an external perspective view showing the semiconductor laser apparatus according to the fourth embodiment.

The semiconductor laser apparatus 530 shown in FIG. 19, which is similar in appearance to the semiconductor laser apparatus 500 of the first embodiment (see FIG. 1), is different in that an output controlling photodiode is provided in the package body 19 in the fourth embodiment.

Now, an inside of the package body 19 of the semiconductor laser apparatus 530 in the fourth embodiment will be described. The direction in which the semiconductor laser devices emit laser beams is defined as a front side.

Figure 20:
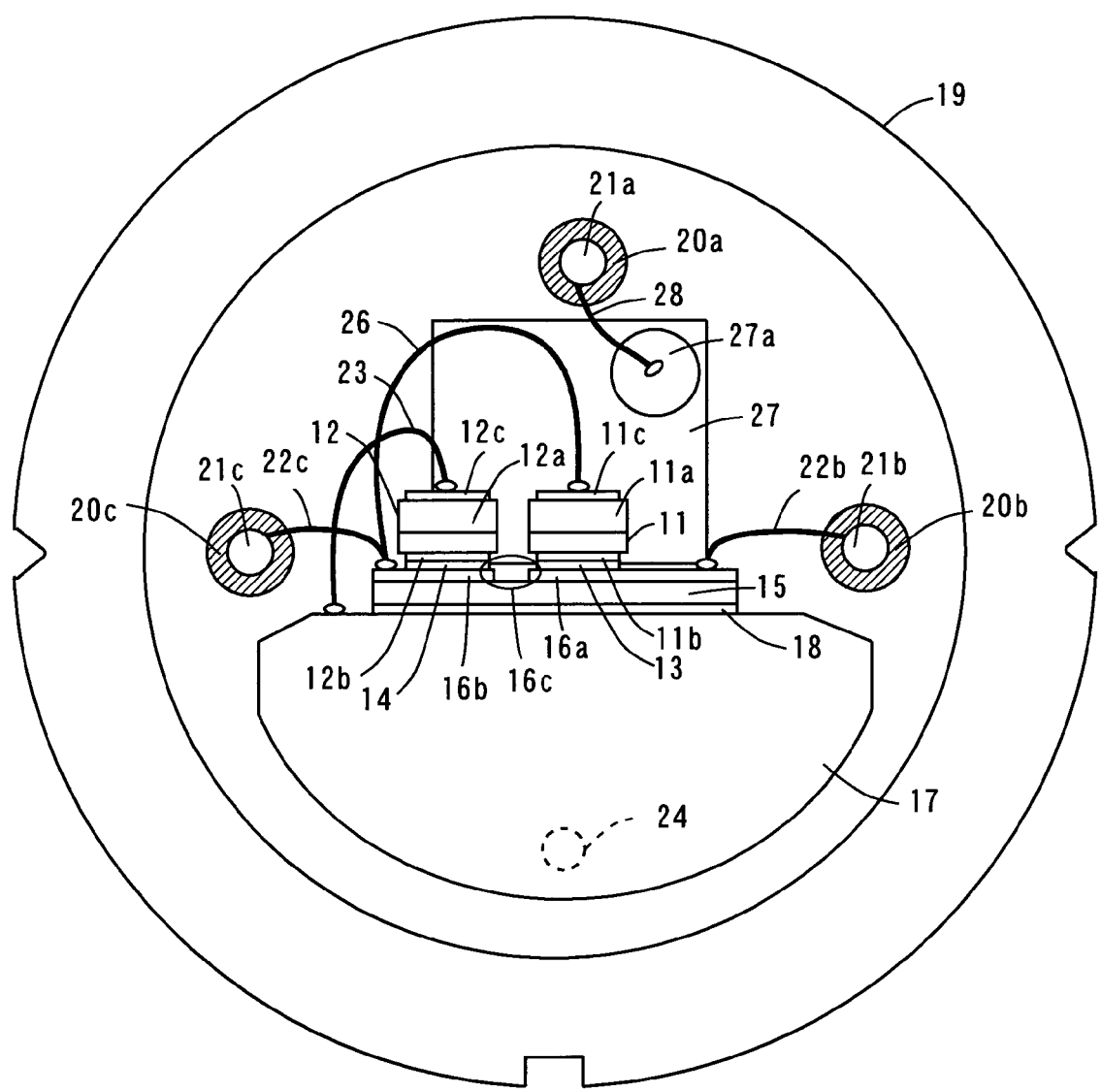
FIG. 20 is a schematic front view showing the semiconductor laser apparatus of FIG. 19 from which the cap has been removed.
Figure 21:
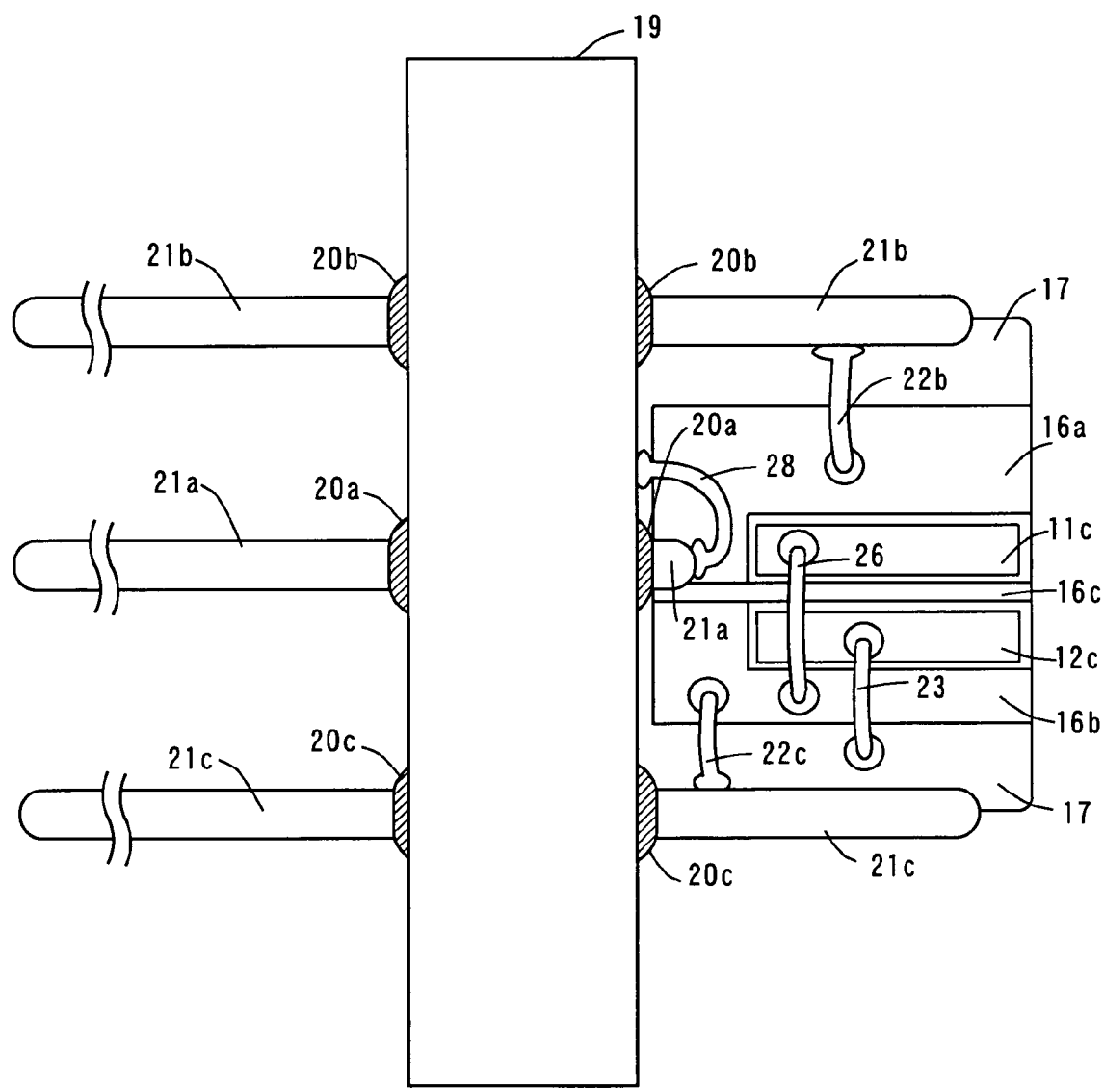
FIG. 21 is a schematic top view showing the semiconductor laser apparatus of FIG. 19 from which the cap has been removed.

FIG. 20 is a schematic front view showing the semiconductor laser apparatus 530 of FIG. 19 from which the cap 25 has been removed. FIG. 21 is a schematic top view showing the semiconductor laser apparatus 530 of FIG. 19 from which the cap 25 has been removed.

The semiconductor laser apparatus 530 shown in FIG. 20 comprises wires 22b, 22c, 23, 26, 28 and an output controlling photodiode 27 instead of the wires 22a to 22c, 23 of the semiconductor laser apparatus 500 shown in FIG. 2.

In the semiconductor laser apparatus 530 of the fourth embodiment, the metallic layer 16a is electrically connected with the power supply pin 21b through the wire 22b. The power supply pin 21b is electrically isolated from the package body 19 through the insulating ring 20b. The metallic layer 16b is electrically connected with the power supply pin 21c through the wire 22c. The power supply pin 21c is electrically isolated from the package body 19 through the insulating ring 20c. The metallic layer 16b is electrically connected with the n-side electrode 11c of the first semiconductor laser device 11 through the wire 26.

The n-side electrode 12c of the second semiconductor laser device 12 is electrically connected to the support base 17 through the wire 23. This results in a structure in which the n-side electrode 12c of the second semiconductor laser device 12 can receive power from the power supply pin 24 which is connected to the package body 19.

A p-side electrode 27a of the photodiode 27 is electrically connected with the power supply pin 21a through the wire 28. The power supply pin 21a is electrically isolated from the package body 19 through the insulating ring 20a. An n-side electrode of the photodiode 27, on the other hand, is mechanically bonded to, and also electronically connected to the package body 19. The wires 22b, 22c, 23, 26, 28 are each made of Au (gold). Note that the first semiconductor laser device 11 and the second semiconductor laser device 12 are similar in structure to the first semiconductor laser device 11 and the second semiconductor laser device 12 shown in FIGS. 6 and 7.

Figure 22:
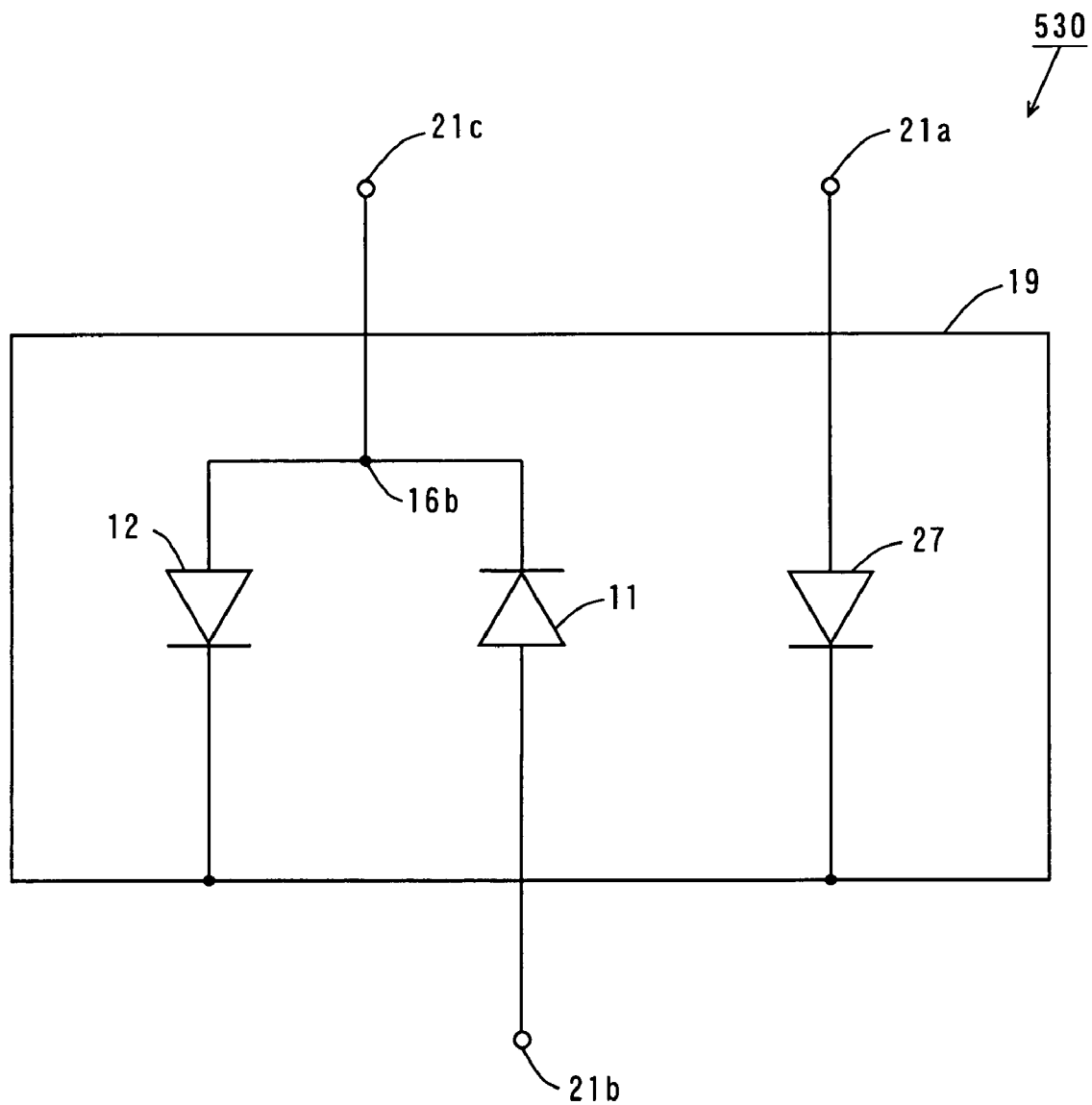
FIG. 22 is a circuit diagram showing electrical wiring of the semiconductor laser apparatus.

Now refer to FIG. 22 which is a circuit diagram showing electrical wiring of the semiconductor laser apparatus 530.

The circuit of the semiconductor laser apparatus 530 shown in FIG. 22 is similar to that of the semiconductor laser apparatus 520 shown in FIG. 17 with the addition of the photodiode 27. How the semiconductor laser apparatus 530 of FIG. 22 differs from the semiconductor laser apparatus 520 of FIG. 17 will hereinafter be described.

The p-side electrode 27a of the photodiode 27 in the semiconductor laser apparatus 530 shown in FIG. 22 is connected to the power supply pin 21a. The n-side electrode thereof, on the other hand, is connected to the package body 19.

According to the foregoing, the photodiode 27 provided in the semiconductor laser apparatus 530 of the fourth embodiment receives the blue-violet laser beam and red laser beam which are emitted from the rear facet of the first semiconductor laser device 11 and the second semiconductor laser device 12, respectively, thereby capable of feedback control of the blue-violet laser beam output and the red laser beam output emitted from the first semiconductor laser device 11 and the second semiconductor laser device 12.

Note that photodiodes in general degrade in their sensitivities upon receiving laser beams with short lasing wavelengths. However, since the first semiconductor laser device 11 is arranged on the central portion of the package body 19, the blue-violet laser beam emitted from the first semiconductor laser device 11 can efficiently be directed toward the photodiode 27 which is arranged on the central portion of the package body 19.

This increases the light intensity of the photodiode 27, which then increases a monitor current flowing in the photodiode 27. This results in improved control signal and noise ratio, allowing the control of semiconductor laser device 11 output to be accurately performed.

Fifth Embodiment

A semiconductor laser apparatus according to a fifth embodiment and an optical apparatus therefor will hereinafter be described.

Figure 23:
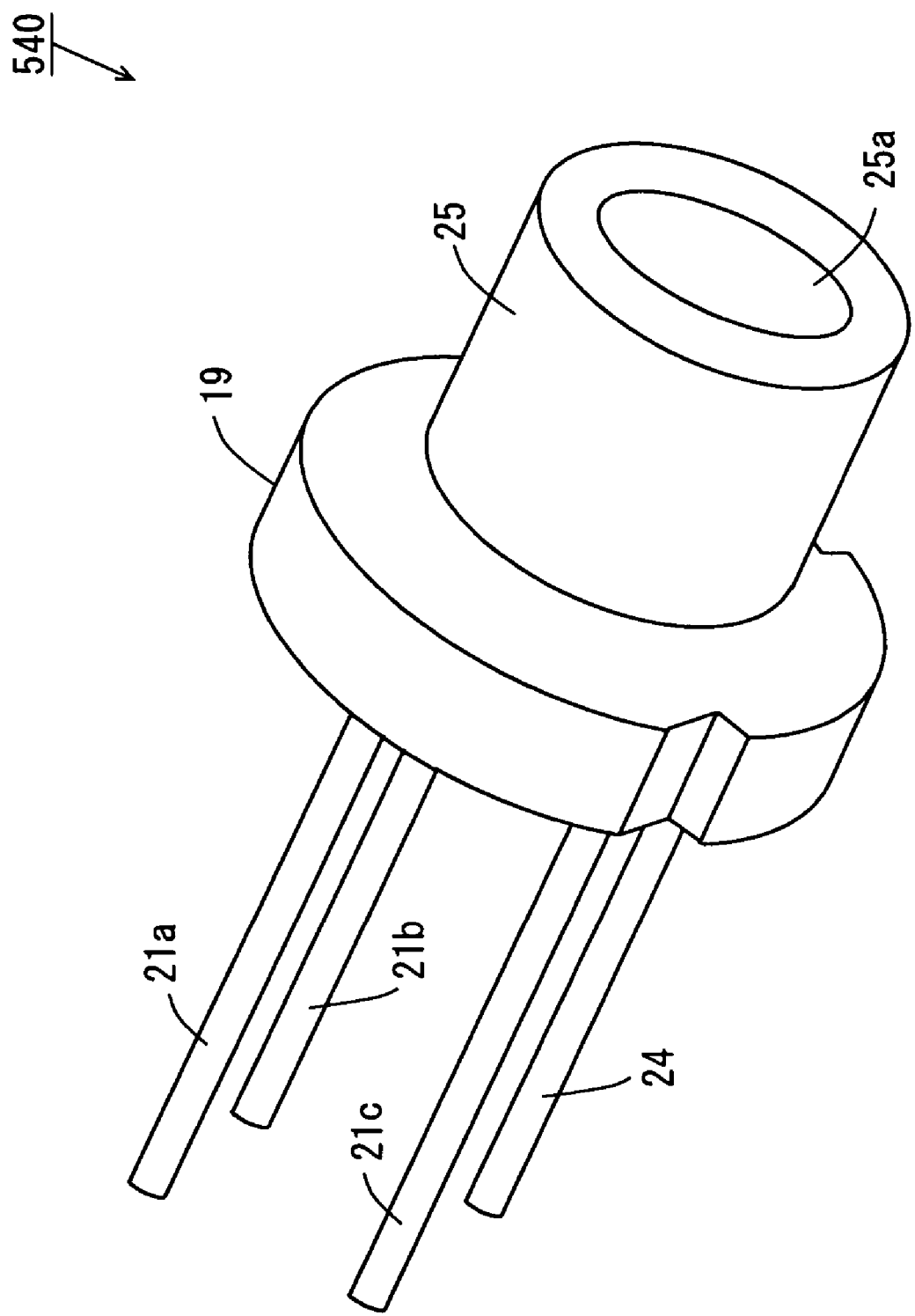
FIG. 23 is an external perspective view showing a semiconductor laser apparatus according to a fifth embodiment.

FIG. 23 is an external perspective view showing the semiconductor laser apparatus according to the fifth embodiment.

The semiconductor laser apparatus 540 shown in FIG. 23 include a conductive package body 19, power supply pins 21a, 21b, 21c, 24, and a cap 25, as with the first semiconductor laser apparatus 500. The semiconductor laser apparatus 540 of the fifth embodiment comprises a third semiconductor laser device in addition to the first semiconductor laser device 11 and the second semiconductor laser device 12.

An inside of the package body 19 will now be described. The direction in which the semiconductor laser devices emit laser beams is defined as a front side.

Figure 24:
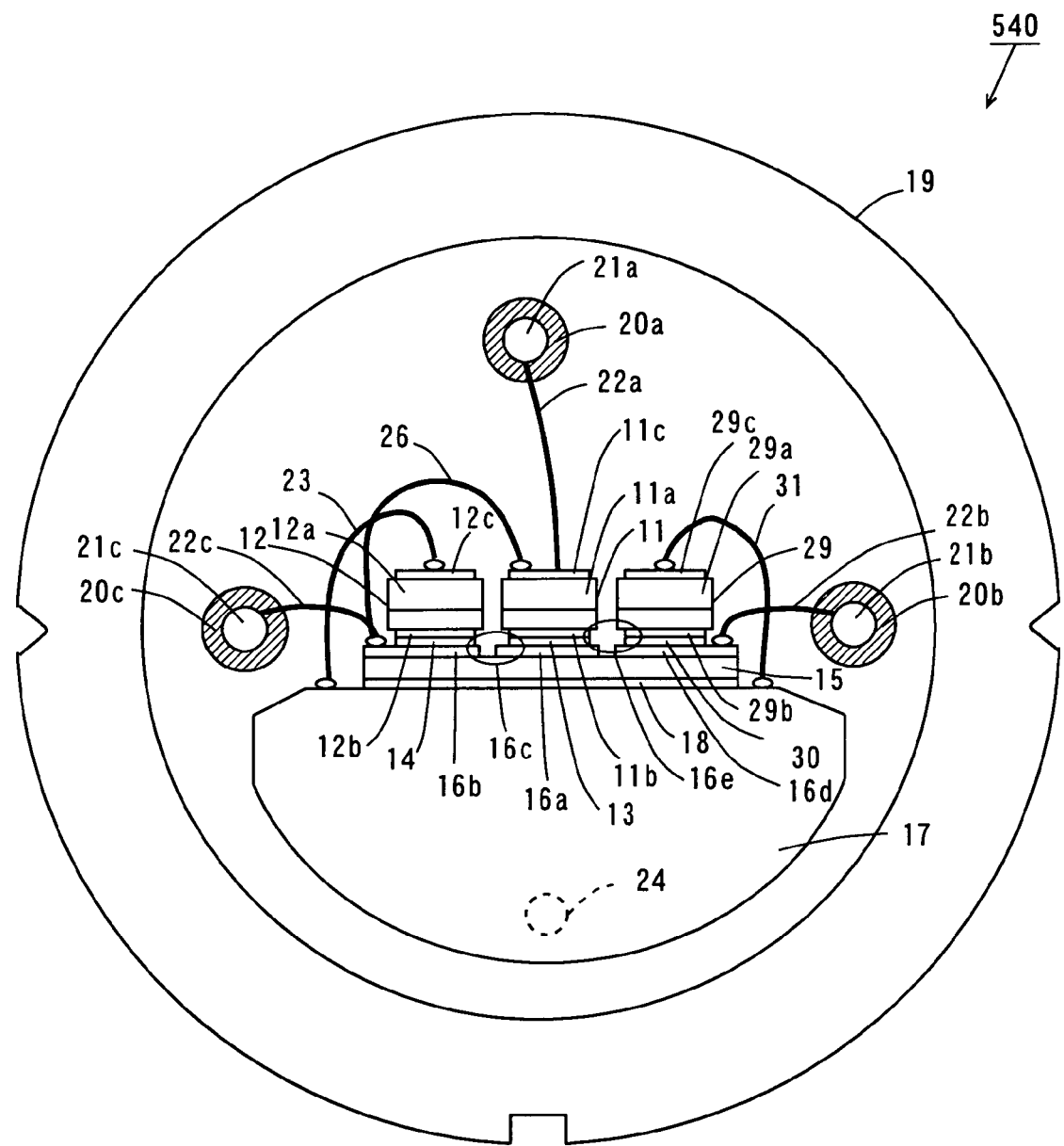
FIG. 24 is a schematic front view showing the semiconductor laser apparatus of FIG. 23 from which the cap has been removed.
Figure 25:
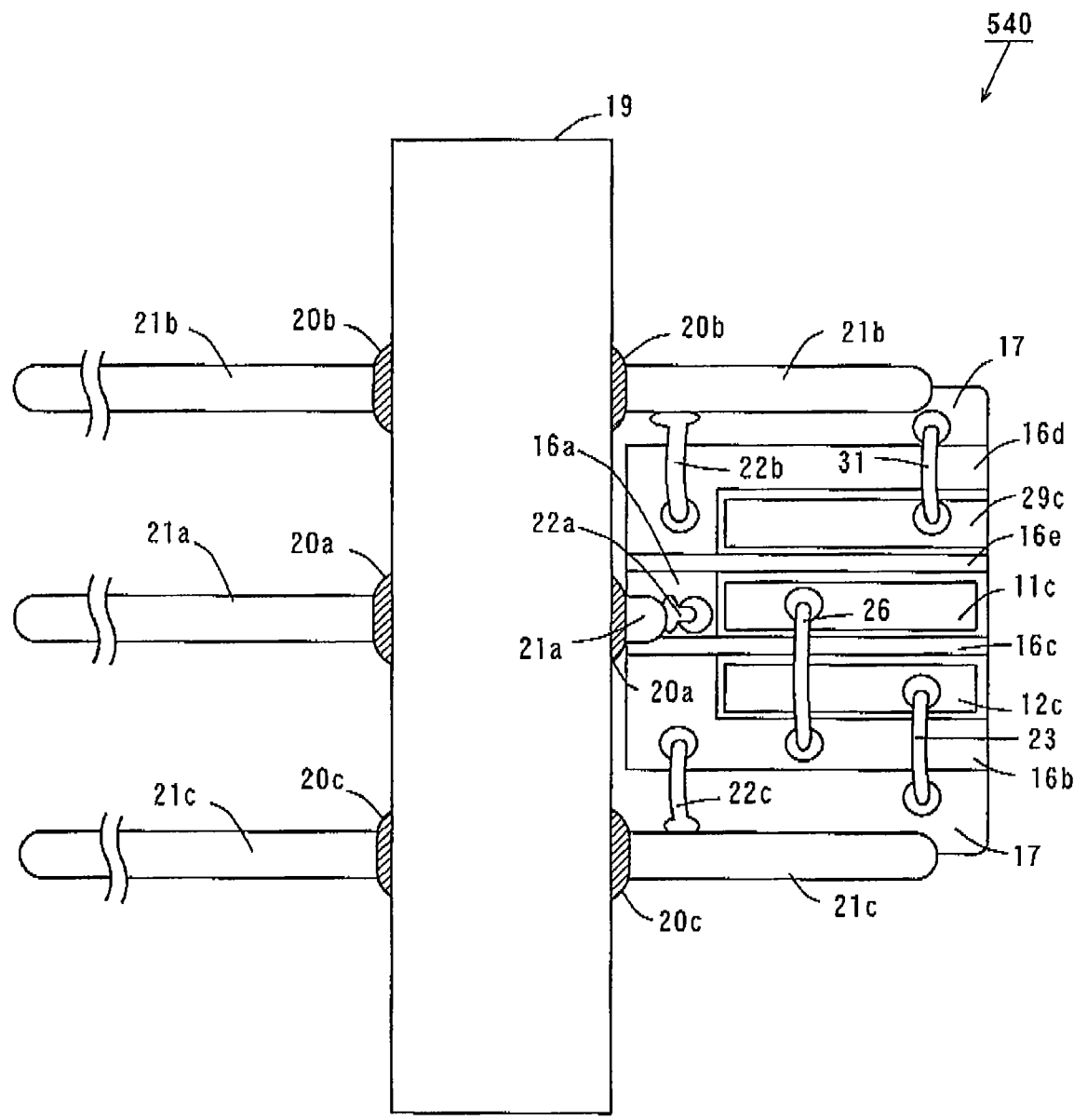
FIG. 25 is a schematic top view showing the semiconductor laser apparatus of FIG. 23 from which the cap has been removed.

FIG. 24 is a schematic front view showing the semiconductor laser apparatus 540 of FIG. 23 from which the cap 25 has been removed. FIG. 25 is a schematic top view showing the semiconductor laser apparatus 540 of FIG. 23 from which the cap 25 has been removed. The semiconductor laser apparatus 540 differs from the semiconductor laser apparatus 500 of the first embodiment, as will be described below.

As shown in FIG. 24, a conductive fusion layer 18 is formed on a conductive support base 17 integral with the package body 19. The conductive fusion layer 18 is made of AuSn (gold tin). A submount 15 is formed on the conductive fusion layer 18. Metallic layers 16a, 16b, 16d are formed on the submount 15. A gap 16c is provided between the metallic layers 16a, 16b, and a gap 16e is provided between the metallic layers 16b, 16d, for electrical insulation.

A fusion layer 13 is formed on the metallic layer 16a, a fusion layer 14 is formed on the metallic layer 16b, and a fusion layer 30 is formed on the metallic layer 16d. The fusion layers 13, 14, 30 are each made of conductive AuSn (gold tin). A first semiconductor laser device 11 is bonded onto the fusion layer 13, a second semiconductor laser device 12 is bonded onto the fusion layer 14, and a third semiconductor laser device 29 is bonded onto the fusion layer 30.

Note that the first semiconductor laser device 11 is arranged in a position closer to the central portion of the laser extracting window 25a (see FIG. 1) of the cap 25 than the second semiconductor laser device 12 and the third semiconductor laser device 29.

The metallic layer 16a is electrically connected with the power supply pin 21a through a wire 22a, as shown in FIGS. 24 and 25. The power supply pin 21a is electrically isolated from the package body 19 through an insulating ring 20a. The metallic layer 16b is electrically connected with the power supply pin 21c through a wire 22c. The power supply pin 21c is electrically isolated from the package body 19 through an insulating ring 20c. The metallic layer 16b is electrically connected with the n-side electrode 11c of the first semiconductor laser device 11 through a wire 26. An n-side electrode 12c of the second semiconductor laser device 12 is electrically connected to the support base 17 through a wire 23.

An n-side electrode 29c of the third semiconductor laser device 29 is electrically connected with the support base 17 through a wire 31. The metallic layer 16d is connected to the power supply pin 21 through a wire 22b. The power supply pin 21b is electrically isolated from the package body 19 through an insulating ring 20b. The wires 22a, 22b, 22c, 23, 26, 31 are each made of Au (gold).

Figure 6:
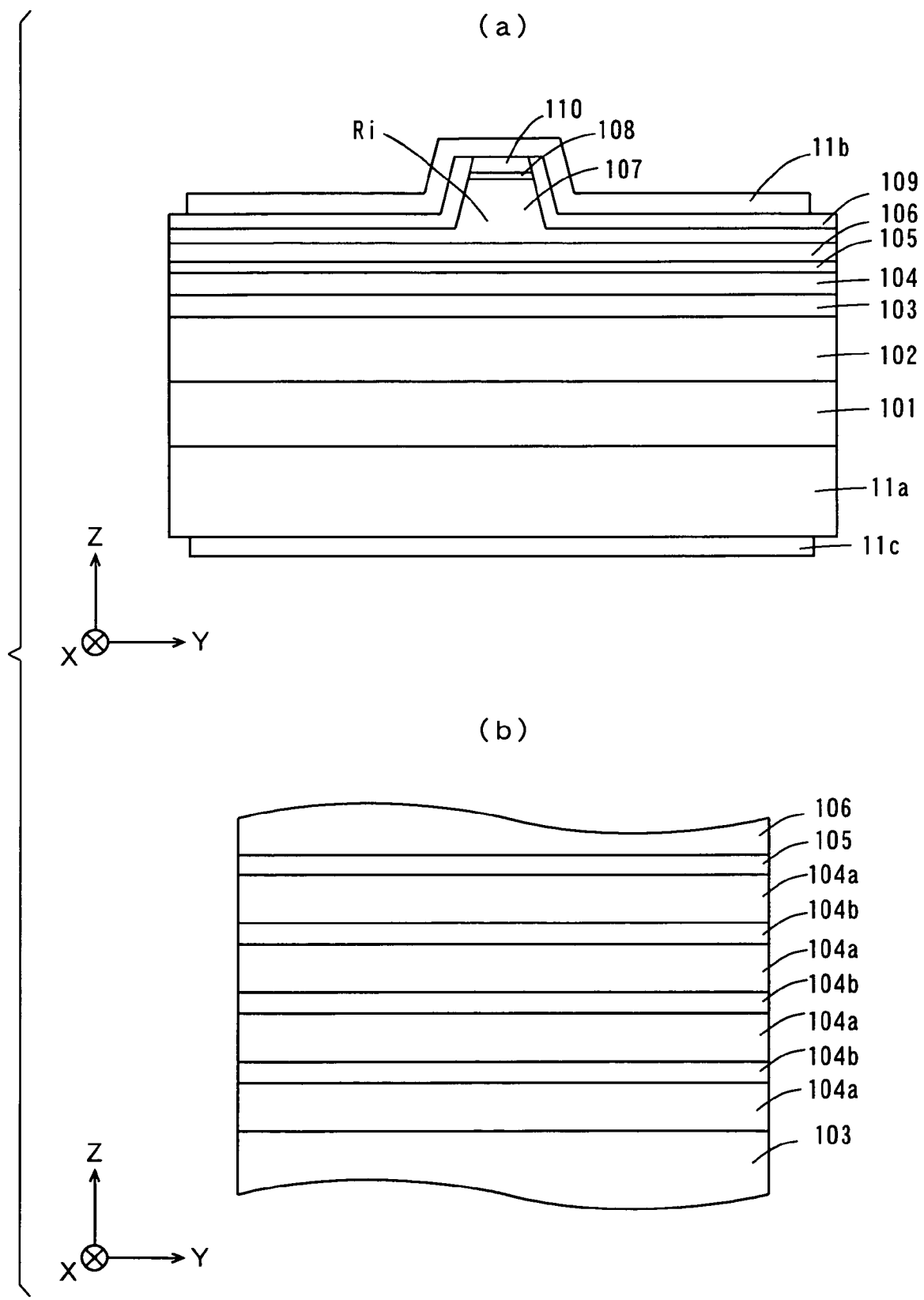
FIGS. 6(a) and 6(b) are schematic cross sections for use in illustrating the structure of a blue-violet semiconductor laser device in detail.
Figure 7:
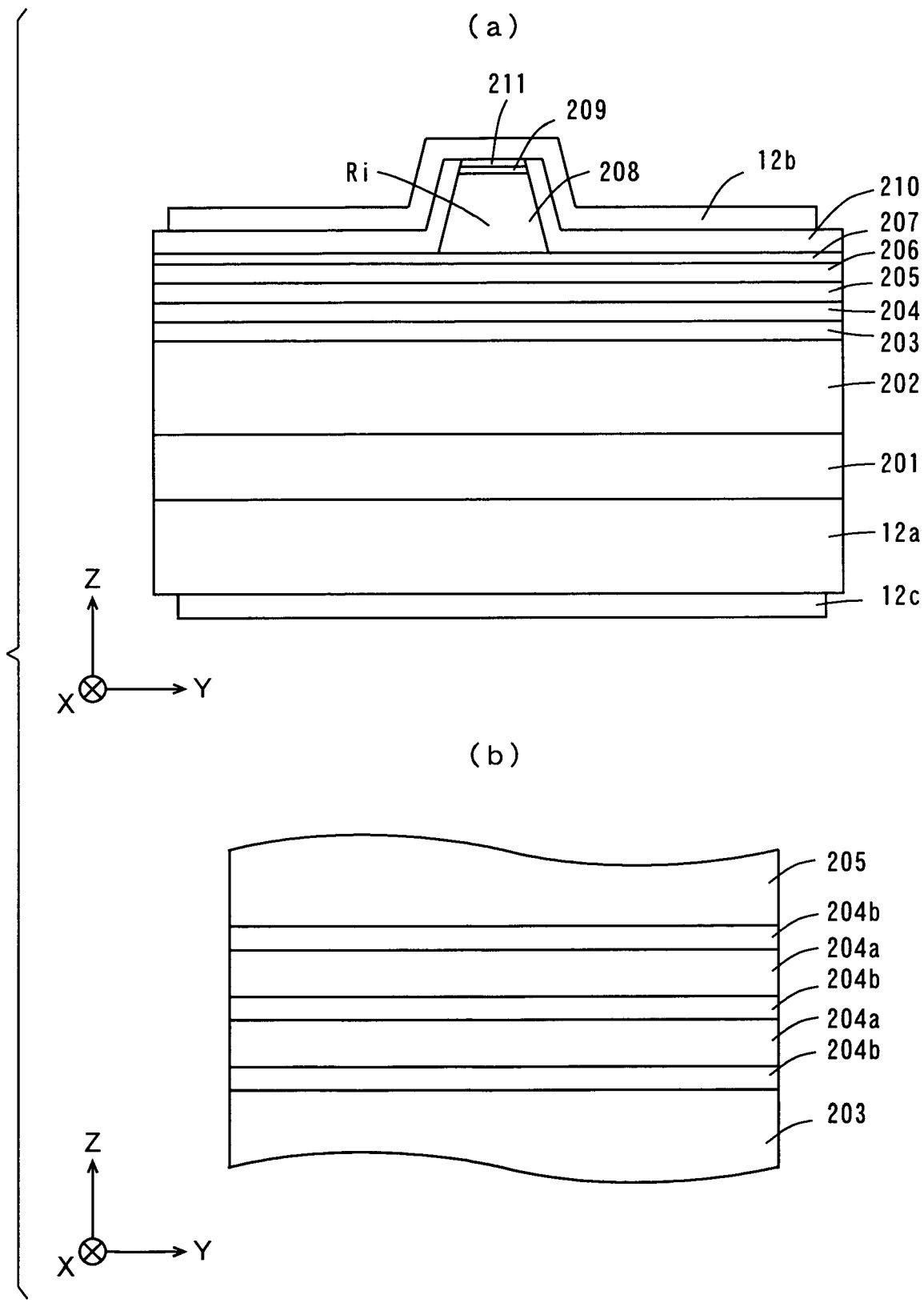
FIGS. 7(a) and 7(b) are schematic cross sections for use in illustrating the structure of a red semiconductor laser device in detail.

Note that the first semiconductor laser device 11 and the second semiconductor laser device 12 in the fifth embodiment are similar in structure to the first semiconductor laser device 11 and the second semiconductor laser device 12 shown in FIGS. 6 and 7. The third semiconductor laser device 29 has a laminated structure that includes a p-side pad electrode 29b, n-type GaAs (gallium arsenide) substrate 29a, and n-side electrode 29c in order. The p-side pad electrode 29b of the third semiconductor laser device 29 is electrically connected with the metallic layer 16d. The third semiconductor laser device 29 of the fifth embodiment, which includes an AlGaAs-based semiconductor layer formed on the n-type GaAs substrate 29a as described below, has a wavelength of approximately 790 nm (i.e., lasing wavelength).

Figure 26:
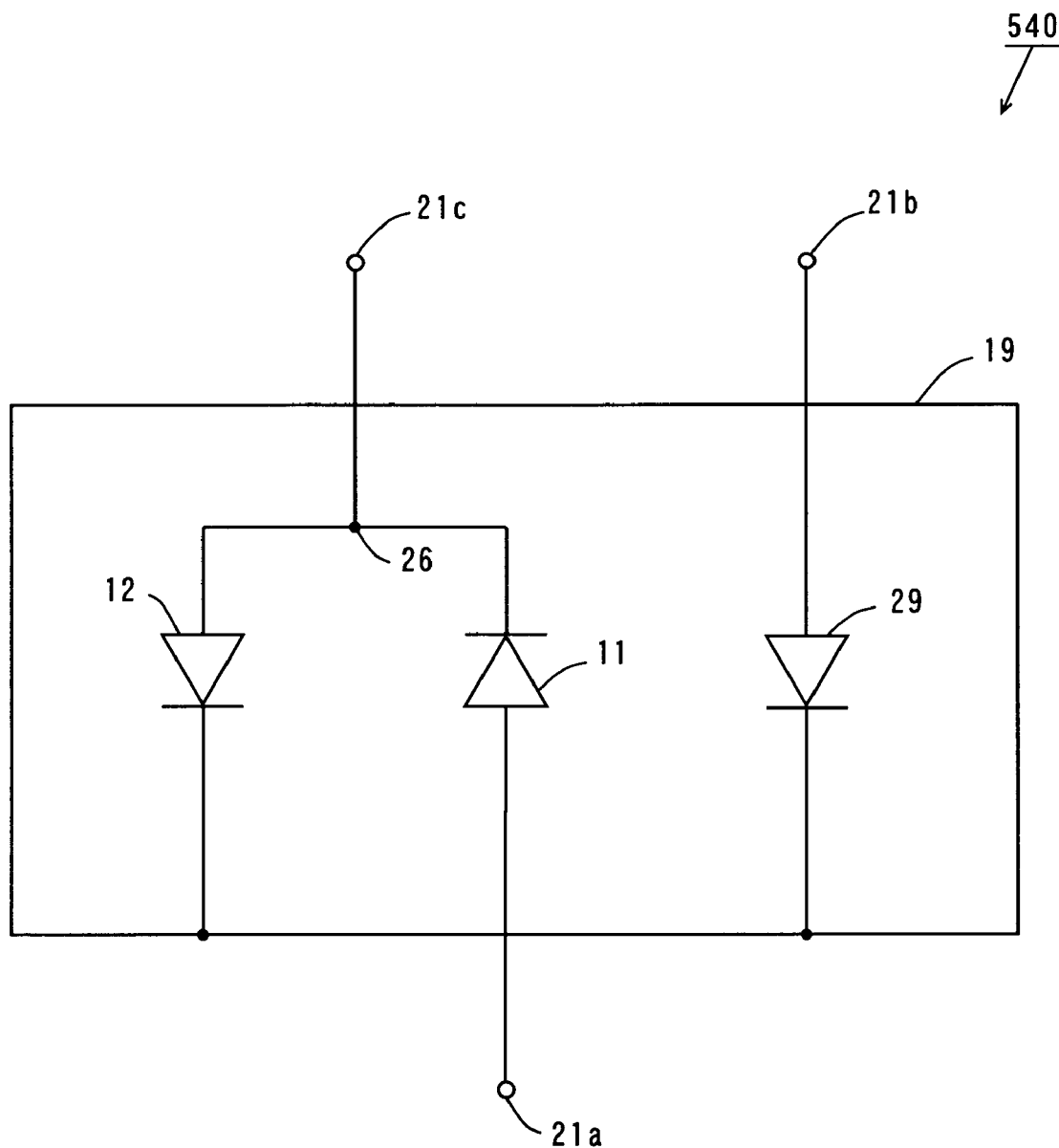
FIG. 26 is a circuit diagram showing electrical wiring of the semiconductor laser apparatus.

Now refer to FIG. 26 which is a circuit diagram showing electrical wiring of the semiconductor laser apparatus 540.

As shown in FIG. 26, the p-side pad electrode 11b and the n-side electrode 11c of the first semiconductor laser device 11 are electrically isolated from the package body 19. The p-side pad electrode 11b of the first semiconductor laser device is connected to the power supply pin 21a, and then-side electrode 11c thereof is connected to the power supply pin 21c through the wires 26, 22c. The p-side pad electrode 12b of the second semiconductor laser device 12 is connected to the power supply pin 21c through the wire 22c, and then-side electrode 12c thereof is electrically connected with the package body 19.

The p-side pad electrode 29b of the third semiconductor laser device 29 is connected to the power supply pin 21b through the wire 22b, and the n-side electrode 29c thereof is electrically connected with the package body 19.

Figure 27:
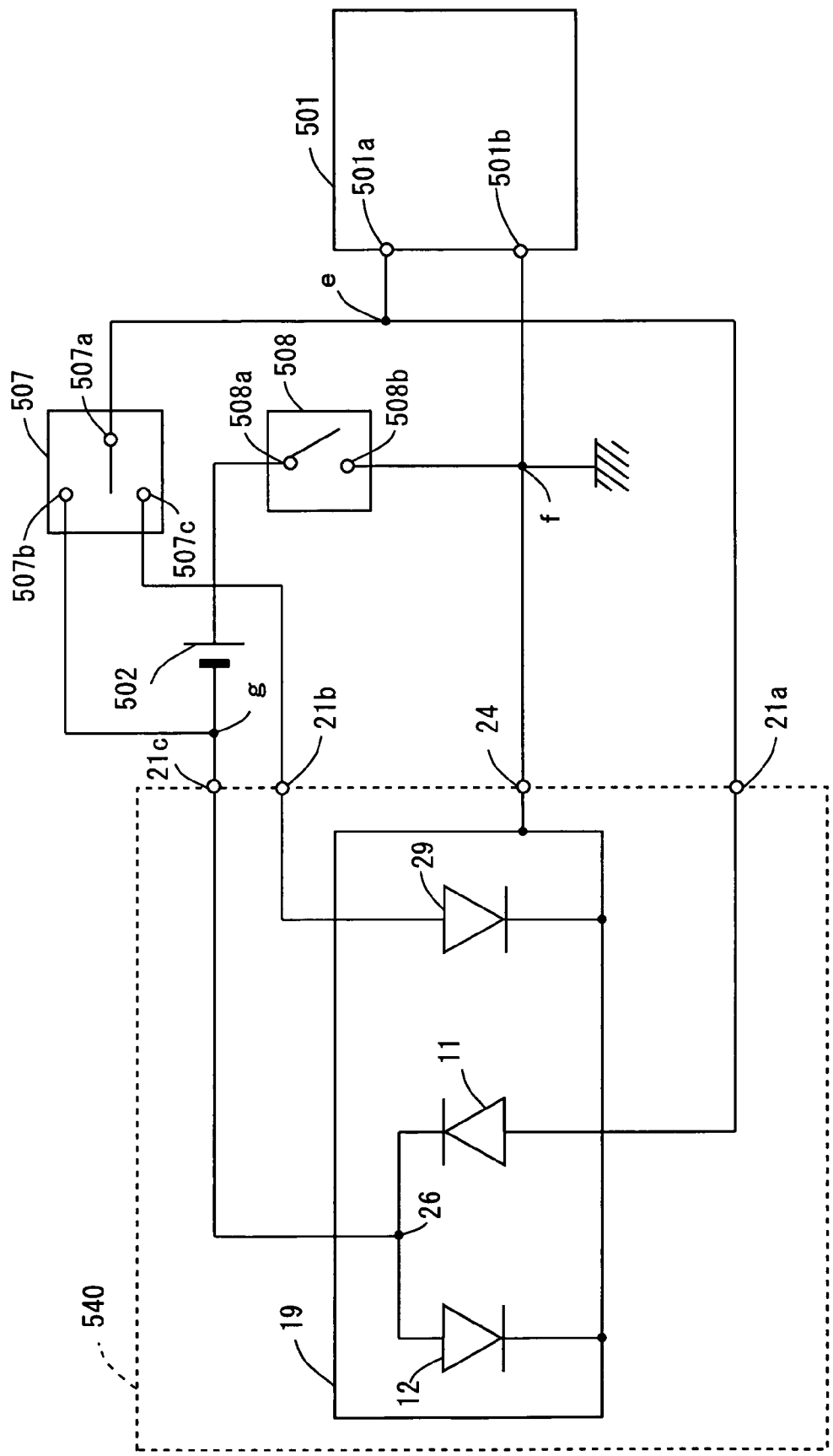
FIG. 27 is a circuit diagram showing electrical wiring of an optical apparatus using the semiconductor laser apparatus of FIG. 26.

Now refer to FIG. 27 which is a circuit diagram showing electrical wiring of an optical apparatus using the semiconductor laser apparatus 540 of FIG. 26.

As shown in FIG. 27, the optical apparatus comprises the semiconductor laser apparatus 540, a drive circuit 501, a dc power supply 502, and switches 507, 508.

The drive circuit 501 of FIG. 27 incorporates a dc power supply (not illustrated) that generates a dc voltage V. The dc voltage V is higher than the lasing threshold voltages of the second semiconductor laser device 12 and third semiconductor laser device 29. The dc power supply 502 outputs a negative (reverse polarity) dc voltage −Va.

An anode terminal 501a of the drive circuit 501 is connected to a node e, which in turn is connected to a terminal 507a of the switch 507, and also connected to the power supply pin 21a in the semiconductor laser apparatus 540.

A cathode terminal 501b of the drive circuit 501 is connected to a node f, which in turn is connected to a terminal 508b of the switch 508, and also connected to the power supply pin 24 in the semiconductor laser apparatus 540. The node f is grounded (0 V).

The power supply pin 21b in the semiconductor laser apparatus 540 is connected to a terminal 507c of the switch 507.

The power supply pin 21c in the semiconductor laser apparatus 540 is connected to a node g. The node g is connected to a terminal 507b of the switch 507, and also connected to a cathode side of the dc power supply 502. An anode side of the dc power supply 502 is connected to a terminal 508a of the switch 508.

For example, when the switch 507 is switched to the terminal 507c, and simultaneously the switch 508 is switched off, the dc power supply incorporated in the drive circuit 501 applies the dc voltage V to the third semiconductor laser device 29. This allows the third semiconductor laser device 29 to emit an infrared laser beam.

When the switch 507 is switched to the terminal 507b, and simultaneously the switch 508 is switched off, the dc power supply incorporated in the drive circuit 501 applies the dc voltage V to the second semiconductor laser device 12. This allows the second semiconductor laser device 12 to emit a red laser beam.

When the switch 507 is switched to the terminal 507b, and simultaneously the switch 508 switches on the terminal 508a, the dc power supply incorporated in the drive circuit 501 applies the dc voltage V to the p-side pad electrode 11b of the first semiconductor laser device 11. At the same time, the dc power supply 502 applies the negative dc voltage −Va to the n-side electrode 11c of the first semiconductor laser device 11. This means that the first semiconductor laser device 11 receives a sum of the voltages V+Va, i.e., the dc voltage from the drive circuit 501 and the negative dc voltage from the dc power supply 502. This allows the first semiconductor laser device 11 to emit a blue-violet laser beam.

Next, the structure of the third semiconductor laser device 29 will be described. Note that the first semiconductor laser device 11 and the second semiconductor laser device 12 are similar in structure to the first semiconductor laser device 11 and the second semiconductor laser device 12 shown in FIGS. 6 and 7. The semiconductor laser device that emits an infrared laser beam will be referred to as an infrared semiconductor laser device.

Figure 28:
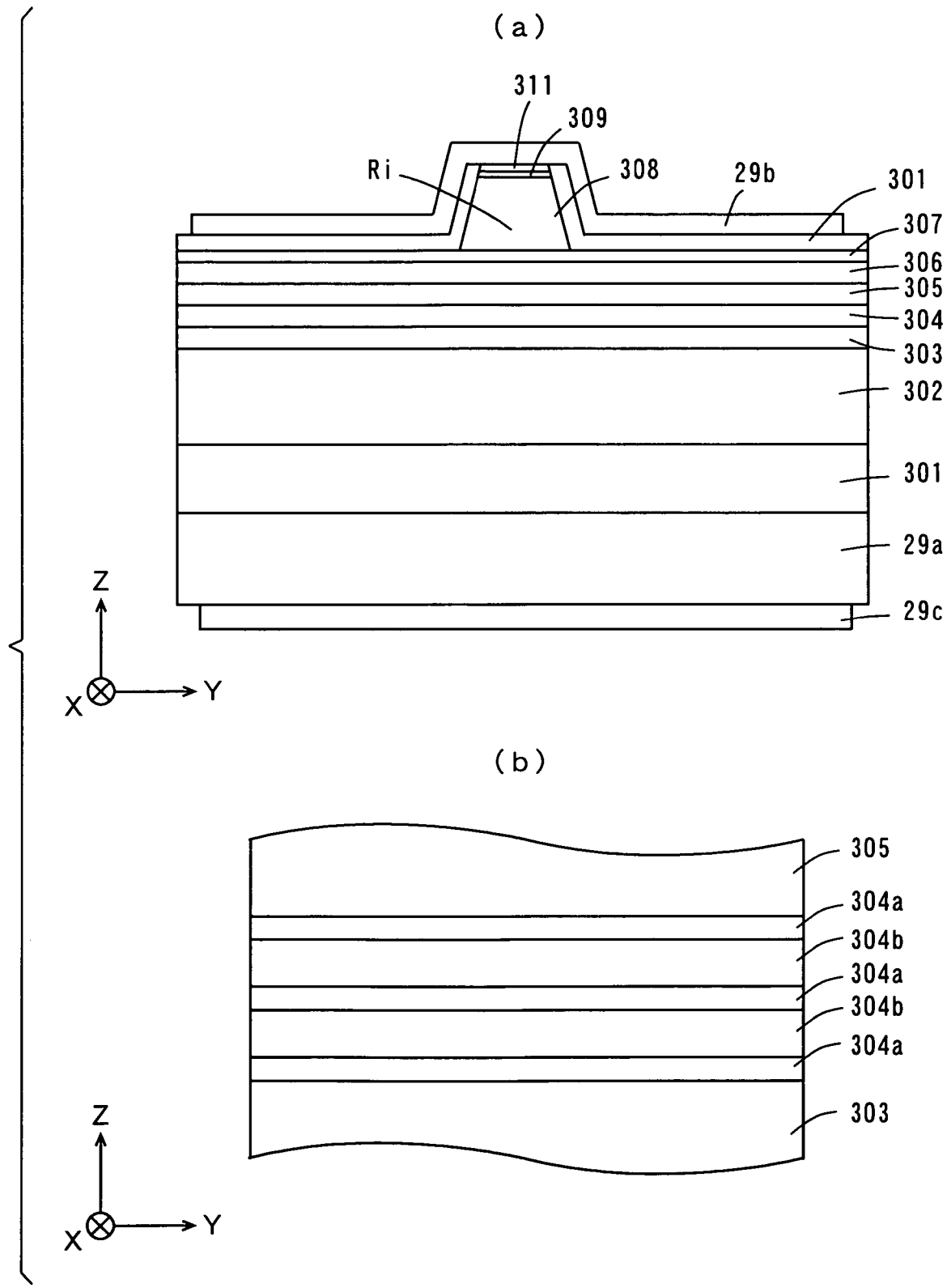
FIGS. 28(a) and 28(b) are schematic cross sections for use in illustrating the structure of an infrared semiconductor laser device in detail.
Figure 29:
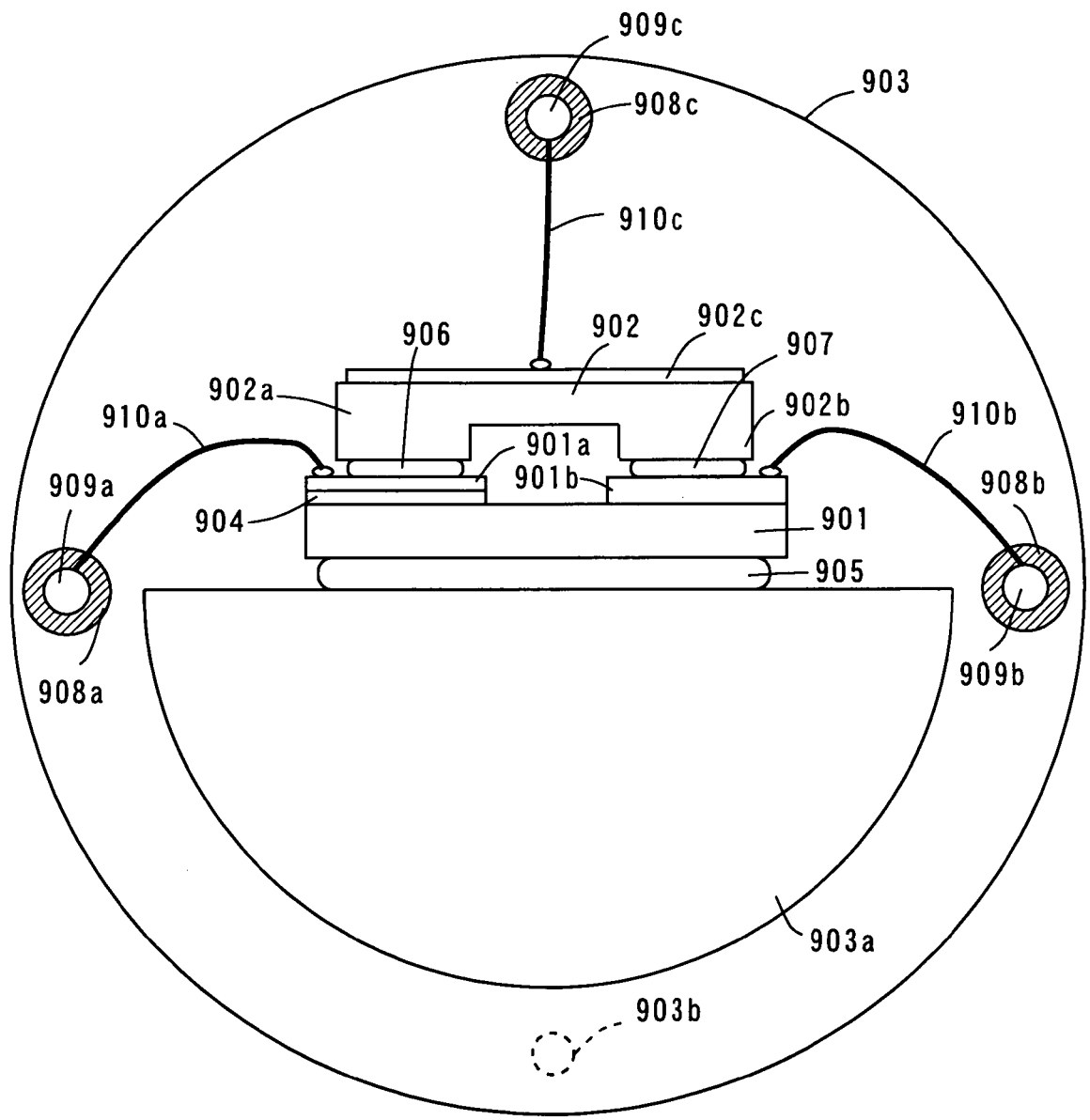
FIG. 29 is a schematic diagram of a semiconductor laser apparatus described in JP 2001-230502 A.
Figure 30:
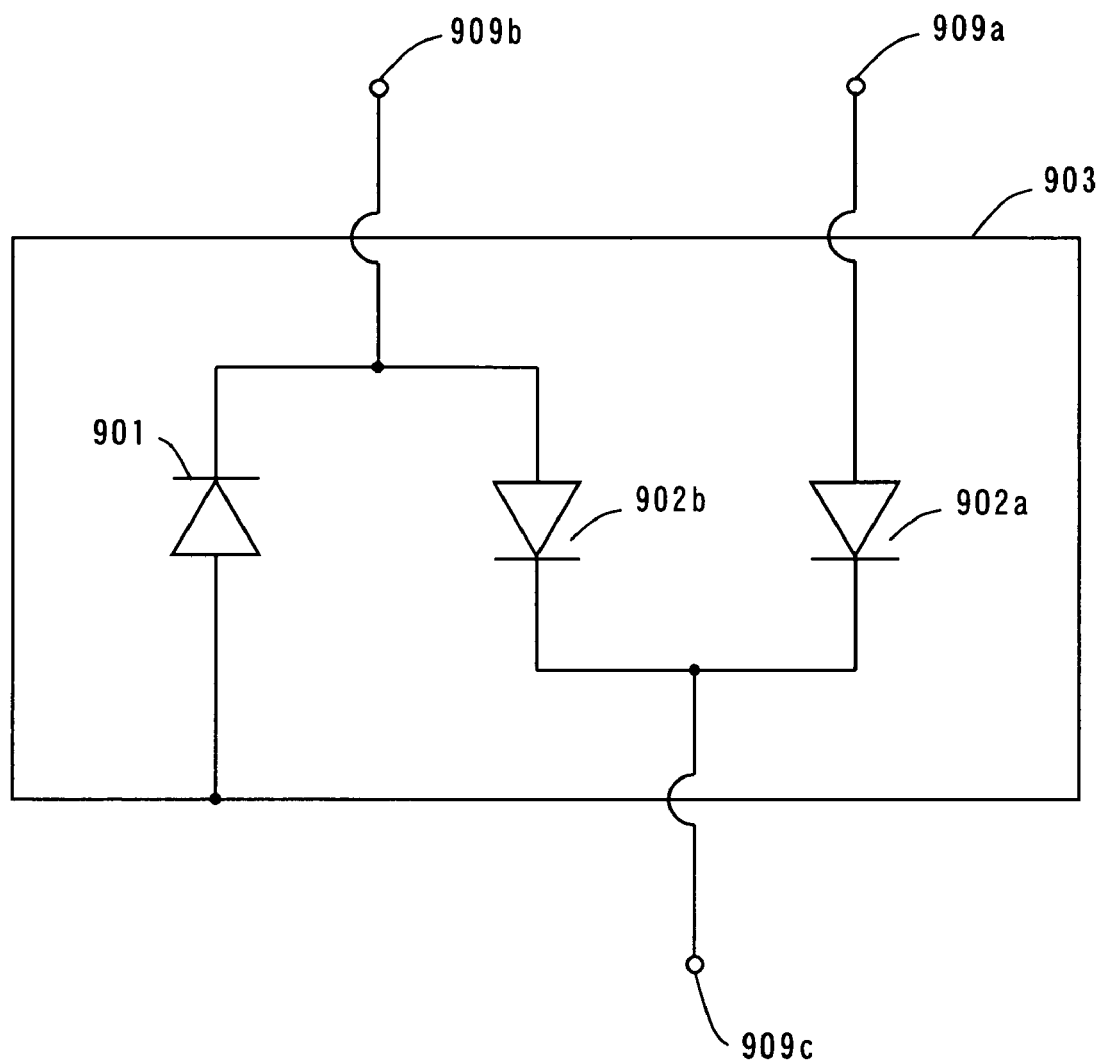
FIG. 30 is a circuit diagram of the semiconductor laser apparatus of FIG. 29.

FIGS. 28(a) and 28(b) are schematic cross sections for use in illustrating the structure of the infrared semiconductor laser device 29 in detail. In FIGS. 28(a) and 28(b) also, the X-, Y-, and Z-directions are defined as in FIGS. 6 and 7.

The infrared semiconductor laser device 29 in the fifth embodiment has an n-type GaAs substrate 29a formed on an n-side electrode 29c and an AlGaAs-based semiconductor layer formed on the n-type GaAs substrate 29a. The n-type GaAs substrate 29a is doped with Si.

As shown in FIG. 28(a), as the AlGaAs-based semiconductor layer, an n-GaAs layer 301, n-AlGaAs cladding layer 302, undoped AlGaAs optical guide layer 303, MQW (multi-quantum well) active layer 304, undoped AlGaAs optical guide layer 305, p-AlGaAs first cladding layer 306, p-AlGaAs etching stop layer 307, p-AlGaAs second cladding layer 308, and p-GaAs contact layer 309 are formed in order on the n-type GaAs substrate 29a. Each of these layers is formed by MOCVD (metal organic chemical vapor deposition), for example.

As shown in FIG. 28(b), the MQW active layer 304 has a structure composed of an alternate lamination of two undoped AlGaAs barrier layers 304a and three undoped AlGaAs well layers 304b.

For example, the n-AlGaAs cladding layer 302 has an Al composition of 0.45 and a Ga composition of 0.55. The n-GaAs layer 301 and n-AlGaAs cladding layer 302 are each doped with Si.

The undoped AlGaAs optical guide layer 303 has an Al composition of 0.35 and a Ga composition of 0.65. The undoped AlGaAs barrier layer 304a has an Al composition of 0.35 and a Ga composition of 0.65. The undoped AlGaAs well layer 304b has an Al composition of 0.10 and a Ga composition of 0.90. The undoped AlGaAs optical guide layer 305 has an Al composition of 0.35 and a Ga composition of 0.65.

The p-AlGaAs first cladding layer 306 has an Al composition of 0.45 and a Ga composition of 0.55. The p-AlGaAs etching stop layer 307 has an Al composition of 0.70 and a Ga composition of 0.30.

The p-AlGaAs second cladding layer 308 has an Al composition of 0.45 and a Ga composition of 0.55.

The p-AlGaAs first cladding layer 306, p-AlGaAs etching stop layer 307, p-AlGaAs second cladding layer 308, and p-GaAs contact layer 309 are each doped with Zn.

In the above-described example, the p-AlGaAs second cladding layer 308 is formed only on a portion (central portion) of the p-AlGaAs etching stop layer 307. Then, the p-GaAs contact layer 309 is formed on the upper surface of the p-AlGaAs second cladding layer 308.

In this manner, the p-AlGaAs second cladding layer 308 and the p-GaAs contact layer 309 of the above-mentioned AlGaAs-based semiconductor layer form a stripe-like ridge portion that extends in the X-direction. The ridge portion Ri formed by the p-AlGaAs second cladding layer 308 and the p-GaAs contact layer 309 has a width of approximately 208 µm.

An insulating film 301 made of SiN is formed on the upper surface of the p-AlGaAs etching stop layer 307, on the sides of the p-AlGaAs second cladding layer 308, and on the upper surface and sides of the p-GaAs contact layer 309, and then the portion of the insulating film 301 formed on the p-GaAs contact layer 309 is etched away. Then, on the p-GaAs contact layer 309 exposed outside, a p-electrode 311 made of Cr/Au is formed. After this, a p-side pad electrode 29b is formed so as to cover the upper surface of the p-electrode 311 by sputtering, vacuum evaporation or electron beam evaporation.

Thus, the AlGaAs-based semiconductor layer is formed with the laminated structure on one surface of the n-GaAs substrate 29a.

The infrared semiconductor laser device 29 has an infrared-beam-emission point at a position in the MQW active layer 304 below the ridge portion Ri.

According to the foregoing, in the semiconductor laser apparatus 540 of the fifth embodiment, current flow is prevented in the second semiconductor laser device 12 and the third semiconductor laser device 29 by the application of voltages in the reverse direction during driving of the first semiconductor laser device 11, allowing the first semiconductor laser device to be driven independently.

In addition, even if the first semiconductor laser device 11, second semiconductor laser device 12, and third semiconductor laser device 29 are mounted in the same package body 19, the number of the power supply pins remains the same as the conventional number. This allows the first semiconductor laser device 11, second semiconductor laser device 12, and third semiconductor laser device 29 to emit a blue-violet laser beam, red laser beam, and infrared laser beam, respectively, while compatibility with conventional semiconductor laser devices is maintained.

(Correspondence Between Each Claim Element and Each Component of Embodiments)

In the first embodiment to fifth embodiment, the n-side electrodes 11c, 12c, 29c each correspond to a first electrode or a second electrode, and the p-side pad electrodes 11b, 12b, 29b each correspond to a second electrode or a first electrode. Then-side electrodes 11c, 12c, 29c each correspond to a cathode, and the p-side pad electrodes 11b, 12b, 29b each correspond to an anode. The n-side electrode of the photodiode 27 corresponds to a first electrode or a second electrode, and the p-side electrode 27a thereof corresponds to a second electrode or a first electrode. The n-side electrode of the photodiode 27 corresponds to a cathode, and the p-side electrode 27a thereof corresponds to an anode.

The first semiconductor laser device 11 corresponds to a first semiconductor laser device, and the blue-violet laser beam corresponds to a light beam having a first wavelength. The second semiconductor laser device 12 corresponds to a second semiconductor laser device, and the red laser beam corresponds to a light beam having a second wavelength. The third semiconductor laser device 29 corresponds to a third semiconductor laser device, and the infrared laser beam corresponds to a light beam having a third wavelength.

The package body 19 corresponds to a package, the drive circuit 501 corresponds to a first power supply, and the dc power supply 502 corresponds to a second power supply.

Other Embodiments

In the first embodiment to fifth embodiment, examples of the first semiconductor laser device 11, second semiconductor laser device 12, and third semiconductor laser device 29 have been discussed, each of which has a constant relation between the lasing threshold voltage and the lasing wavelength. The present invention, however, is not limited to such examples, and can similarly be applied to semiconductor laser devices that do not have a constant relation between the lasing threshold voltage and the lasing wavelength.

In each of the first to third embodiments and fifth embodiment, the drive circuit 501 incorporates the dc power supply that generates the dc voltage V; however, it may alternatively incorporate a power supply that generates a dc voltage on which a sine wave is modulated or a power supply that generates a voltage on which a square wave is modulated, for example.

In each of the first embodiment to fifth embodiment, the first semiconductor laser device 11, second semiconductor laser device 12, and third semiconductor laser device 29 are disposed such that the respective p-side pad electrodes lie on the support base side; however, the first to third semiconductor laser devices 11, 12, 29 may be disposed such that the respective n-side electrodes lie on the support base side.

In each of the first embodiment to fifth embodiment, the first semiconductor laser device 11, second semiconductor laser device 12, and third semiconductor laser device 29 are disposed such that they are aligned in a lateral direction; however, any of the first to third semiconductor laser devices 11, 12, 29 may be disposed such that it is stacked on another semiconductor laser device. In this case, in order to supply different voltages to the electrodes of the stacked plurality of semiconductor laser devices, respectively, layers for electrically isolating each of the semiconductor laser devices may be inserted among the semiconductor laser devices.

More specifically, in each of the first embodiment to fourth embodiment, the second semiconductor laser device 12 may be disposed such that it is stacked on the first semiconductor laser device 11 with a short wavelength with an insulating layer inserted therebetween, for example. In the fifth embodiment, either of the second semiconductor laser device 12 and the third semiconductor laser device 29 may be disposed such that it is stacked on the first semiconductor laser device 11 with a short wavelength with an insulating layer inserted between the first semiconductor laser device 11 and either of the second semiconductor laser device 12 and third semiconductor laser device 29. Alternatively, both of the second semiconductor laser device 12 and the third semiconductor laser device 29 may be disposed such that they are stacked laterally in alignment with each other on the first semiconductor laser device 11, with an insulating film inserted between the first semiconductor laser device 11 and the second semiconductor laser device 12 and third semiconductor laser device 29.

Where in the fifth embodiment, both of the second semiconductor laser device 12 and the third semiconductor laser device 29 are disposed laterally in alignment with each other on the first semiconductor laser device 11 with a short wavelength, with an insulating film inserted between the first semiconductor laser device 11 and the second semiconductor laser device 12 and the third semiconductor laser device 29, the emission point of the second semiconductor laser device 12 may be disposed such that it is located close to just above the emission point of the first semiconductor laser device 11. Alternatively, the emission point of the third semiconductor laser device 29 may be disposed such that it is located close to just above the emission point of the first semiconductor laser device 11. Still alternatively, the emission points of the second semiconductor laser device 12 and the third semiconductor laser device 29 may be disposed such that they sandwich the emission point of the first semiconductor laser device 11. Still alternatively, the emission points of the first semiconductor laser device 11 and the third semiconductor laser device 29 may be disposed such that they sandwich the emission point of the second semiconductor laser device 12. Still alternatively, the emission points of the first semiconductor laser device 11 and the second semiconductor laser device 12 may be disposed such that they sandwich the emission point of the third semiconductor laser device 29.

In the fifth embodiment, the second semiconductor laser device 12 and the third semiconductor laser device 29 may be integrally formed on the same substrate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus comprising:
    a first semiconductor laser device that has a first electrode and a second electrode and emits a light beam having a first wavelength;
    a second semiconductor laser device that has a first electrode and a second electrode and emits a light beam having a second wavelength longer than said first wavelength; and
    a conductive package that houses said first and said second semiconductor laser devices;
    first and second power supply pins provided in said package; and
    a submount made of an insulator on which said first semiconductor laser device and said second semiconductor laser device are arranged, wherein
    said first and second power supply pins are electrically isolated from said package,
    wherein said first electrode and said second electrode of said first semiconductor laser device are electrically connected to said first and second power supply pins, respectively, and simultaneously electrically isolated from said package by said submount, and
    said first electrode or said second electrode of said second semiconductor laser device is electrically connected to said package.

2. The semiconductor laser apparatus according to claim 1, wherein
    said first semiconductor laser device is made of a material that includes a nitride semiconductor.

3. The semiconductor laser apparatus according to claim 1, wherein
    said first semiconductor laser device is arranged closer to a central portion of said package than said second semiconductor laser device.

4. The semiconductor laser apparatus according to claim 1, wherein
    said first semiconductor laser device has a first lasing threshold voltage, and
    said second semiconductor laser device has a second lasing threshold voltage lower than said first lasing threshold voltage.

5. The semiconductor laser apparatus according to claim 1, wherein
    said first electrode of said second semiconductor laser device is connected to said package, and
    said second electrode of said first semiconductor laser device and said second electrode of said second semiconductor laser device are connected.

6. The semiconductor laser apparatus according to claim 5, wherein
    said second electrode of said first semiconductor laser device is an anode, and said second electrode of said second semiconductor laser device is an anode.

7. The semiconductor laser apparatus according to claim 5, wherein
    said second electrode of said first semiconductor laser device is a cathode, and said second electrode of said second semiconductor laser device is an anode.

8. The semiconductor laser apparatus according to claim 1, wherein
    each of said first and said second semiconductor laser devices has a front facet and a rear facet that emit light beams, respectively, and
    said semiconductor laser apparatus further comprises a photodiode that has a first electrode and a second electrode and receives the light beams emitted from said rear facet of said first and said second semiconductor laser devices, said first electrode of said photo diode being electrically connected with said package.

9. The semiconductor laser apparatus according to claim 1, further comprising:
    a third semiconductor laser device that has a first electrode and a second electrode and emits a light beam having a third wavelength longer than said first wavelength, and
    a third power supply pin provided in said package, wherein
    said third power supply pin is electrically isolated from said package, and
    said first electrode and said second electrode of said third semiconductor laser device are electrically connected with said package and said third power supply pin, respectively.

10. The semiconductor laser apparatus according to claim 9, wherein
    said first semiconductor laser device has a first lasing threshold voltage, and
    said third semiconductor laser device has a third lasing threshold voltage lower than said first lasing threshold voltage.

11. A semiconductor laser apparatus comprising:
    a first semiconductor laser device that has a first electrode and a second electrode and has a first lasing threshold voltage;
    a second semiconductor laser device that has a first electrode and a second electrode and has a second lasing threshold voltage lower than said first lasing threshold voltage; and a conductive package that houses said first and said second semiconductor laser devices;

first and second power supply pins provided in said package; and a submount made of an insulator on which said first semiconductor laser device and said second semiconductor laser device are arranged, wherein said first and second power supply pins are electrically isolated from said package, said first electrode and said second electrode of said first semiconductor laser device are electrically connected to said first and second power supply pins, respectively, and simultaneously electrically isolated from said package by said submount, and said first electrode or said second electrode of said second semiconductor laser device is electrically connected to said package.

12. An optical apparatus comprising:

a semiconductor laser apparatus;

a first power supply; and a second power supply, wherein said semiconductor laser apparatus comprises:

a first semiconductor laser device that has a first electrode and a second electrode and has a first lasing threshold voltage;

a second semiconductor laser device that has a first electrode and a second electrode and has a second lasing threshold voltage lower than said first lasing threshold voltage;

a conductive package that houses said first and said second semiconductor laser devices; and first and second power supply pins provided in said package, wherein said first and second power supply pins are electrically isolated from said package, said first electrode and said second electrode of said first semiconductor laser device are electrically connected to said first and second power supply pins, respectively, said first electrode or said second electrode of said second semiconductor laser device is electrically connected to said package, said second semiconductor laser device being driven by said first power supply, said first power supply applying a potential of one polarity to said second electrode of said first semiconductor laser device through said second power supply pin, and simultaneously, said second power supply applying a potential of a reverse polarity of said one polarity to said first electrode of said first semiconductor laser device through said first power supply pin.

13. The optical apparatus according to claim 12, wherein said first semiconductor laser device emits a light beam having a first wavelength, and said second semiconductor laser device emits a light beam having a second wavelength longer than said first wavelength.

14. The optical apparatus according to claim 13, wherein said first electrode of said second semiconductor laser device is electrically connected with said package.

15. The optical apparatus according to claim 13, wherein said first semiconductor laser device is made of a material that includes a nitride semiconductor.

16. The optical apparatus according to claim 13, further comprising:

a third semiconductor laser device that has a first electrode and a second electrode and emits a light beam having a third wavelength longer than said first wavelength, and a third power supply pin provided in said package, wherein said third power supply pin is electrically isolated from said package, and said first electrode and said second electrode of said third semiconductor laser device are electrically connected with said package and said third power supply pin, respectively.

* * * * *